United States Patent
Yamazoe et al.

(10) Patent No.: US 7,345,297 B2
(45) Date of Patent: Mar. 18, 2008

(54) NITRIDE SEMICONDUCTOR DEVICE

(75) Inventors: Masahito Yamazoe, Anan (JP);
 Masayuki Eguchi, Anan (JP); Hiroki Narimatsu, Anan (JP); Kazunori Sasakura, Anan (JP); Yukio Narukawa, Anan (JP)

(73) Assignee: Nichia Corporation, Tokushima (JP)

( * ) Notice: Subject to any disclaimer, the term of this patent is extended or adjusted under 35 U.S.C. 154(b) by 157 days.

(21) Appl. No.: 11/052,194

(22) Filed: Feb. 8, 2005

(65) Prior Publication Data
 US 2005/0205881 A1 Sep. 22, 2005

(30) Foreign Application Priority Data
 Feb. 9, 2004 (JP) .............................. 2004-032688

(51) Int. Cl.
 *H01L 29/06* (2006.01)
 *H01L 27/15* (2006.01)
(52) U.S. Cl. .............................. 257/12; 257/79; 257/86; 438/46; 438/47; 438/77; 438/94
(58) Field of Classification Search .................. 438/22, 438/24, 37, 46, 47, 77, 93, 94; 257/12, 22, 257/74, 79, 86, E21.085
 See application file for complete search history.

(56) References Cited

U.S. PATENT DOCUMENTS

| | | | |
|---|---|---|---|
| 5,146,465 A | 9/1992 | Khan et al. | |
| 5,408,105 A | 4/1995 | Adachi et al. | |
| 5,656,832 A | 8/1997 | Ohba et al. | |
| 5,679,965 A | 10/1997 | Schetzina | |
| 5,751,752 A | 5/1998 | Shakuda | |
| 5,753,939 A | 5/1998 | Sassa et al. | |
| 5,777,350 A | 7/1998 | Nakamura et al. | |
| 5,828,086 A | 10/1998 | Ishibashi et al. | |

(Continued)

FOREIGN PATENT DOCUMENTS

EP 1063711 A1 12/2000

(Continued)

OTHER PUBLICATIONS

Shuji Nakamura (1998) "InGaN Multiquantum-Well-Structure Laser Diodes with GaN-AlGaN Modulation-Doped Strained-Layer Superlattices," IEEE Journal of Selected Topics in Quantum Electronics 4(3), pp. 483-489.

(Continued)

*Primary Examiner*—Hsien-Ming Lee
(74) *Attorney, Agent, or Firm*—Morrison & Foerster LLP

(57) ABSTRACT

A semiconductor device includes an active layer, an n-side contact layer, and a p-side contact layer. The nitride semiconductor device includes at least a first n-side layer, a second n-side layer, a third n-side layer and a fourth n-side layer formed in this order from the n-side contact layer between the n-side contact layer and the active layer, while at least the second n-side layer and the fourth n-side layer each contain an n-type impurity, and the concentration of the n-type impurity in at least the second n-side layer and the fourth n-side layer is higher than the concentration of the n-type impurity in the first n-side layer and the third n-side layer.

22 Claims, 12 Drawing Sheets

U.S. PATENT DOCUMENTS

| | | | |
|---|---|---|---|
| 5,932,896 | A | 8/1999 | Sugiura et al. |
| 5,959,307 | A | 9/1999 | Nakamura et al. |
| 5,959,401 | A | 9/1999 | Asami et al. |
| 5,987,048 | A | 11/1999 | Ishikawa et al. |
| 6,172,382 | B1 | 1/2001 | Nagahama et al. |
| 6,198,112 | B1 | 3/2001 | Ishida et al. |
| 6,337,493 | B1 | 1/2002 | Tanizawa et al. |
| 6,838,705 | B1 | 1/2005 | Tanizawa |
| 2003/0010993 | A1 | 1/2003 | Nakamura et al. |
| 2004/0056242 | A1* | 3/2004 | Ohno et al. .............. 257/13 |

FOREIGN PATENT DOCUMENTS

| | | |
|---|---|---|
| JP | 62-224095 | 10/1987 |
| JP | 03-257887 | 11/1991 |
| JP | 04-068579 | 3/1992 |
| JP | 05-082834 | 4/1993 |
| JP | 05-291618 | 11/1993 |
| JP | 06-151966 | 5/1994 |
| JP | 07-249795 | 9/1995 |
| JP | 07-263744 | 10/1995 |
| JP | 08-023124 | 1/1996 |
| JP | 08-51251 | 2/1996 |
| JP | 08-056015 | 2/1996 |
| JP | 08-83956 | 3/1996 |
| JP | 08-97471 | 4/1996 |
| JP | 08-228025 | 9/1996 |
| JP | 08-330629 | 12/1996 |
| JP | 10-326943 | 12/1996 |
| JP | 09-36430 | 2/1997 |
| JP | 09-232629 | 9/1997 |
| JP | 09-298341 | 11/1997 |
| JP | 09-312416 | 12/1997 |
| JP | 10-004210 | 1/1998 |
| JP | 10-024581 | 1/1998 |
| JP | 10-027923 | 1/1998 |
| JP | 10-051030 | 2/1998 |
| JP | 10-93192 | 4/1998 |
| JP | 10-135575 | 5/1998 |
| JP | 10-223983 | 8/1998 |
| JP | 10-242512 | 9/1998 |
| JP | 10-242569 | 9/1998 |
| JP | 10-242587 | 9/1998 |
| JP | 10-256662 | 9/1998 |
| JP | 10-261816 | 9/1998 |
| JP | 10-270755 | 10/1998 |
| JP | 10-290047 | 10/1998 |
| JP | 10-303493 | 11/1998 |
| JP | 10-308558 | 11/1998 |
| JP | 10-335757 | 12/1998 |
| JP | 11-031841 | 2/1999 |
| JP | 11-068155 | 3/1999 |
| JP | 11-177175 | 7/1999 |
| JP | 2000-232237 | 8/2000 |
| JP | 2000-286509 | 10/2000 |
| JP | 2001-148507 | 5/2001 |
| WO | WO-98/31055 A1 | 7/1998 |
| WO | WO-99/05728 A1 | 2/1999 |
| WO | WO-99/46822 A1 | 9/1999 |
| WO | WO-00/59046 A1 | 10/2000 |

OTHER PUBLICATIONS

Shuji Nakamura et al. (1997) "InGaN/GaN/AlGaN-Based Layer Diodes with Modulation-Doped Strained-Layer Superlattices," Jpn J. Appl. Phys. 36, pp. 1568-1571.

Takashi Mukai et al. (1998) "Amber InGaN-Based Light-Emitting Diodes Operable at High Ambient Temperatures," Jpn. J. Appl. Phys. 37, pp. L479-L481.

Takashi Mukai et al. "InGaN-Based Blue Light-Emitting Diodes Grown on Epitaxially Laterally Overgrown GaN Substrates," Jpn. J. Appl. Phys. 37, pp. L839-L841.

* cited by examiner

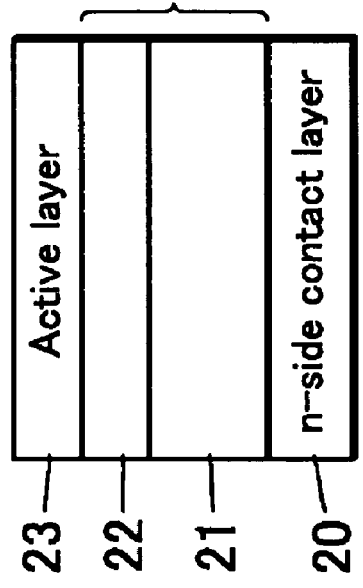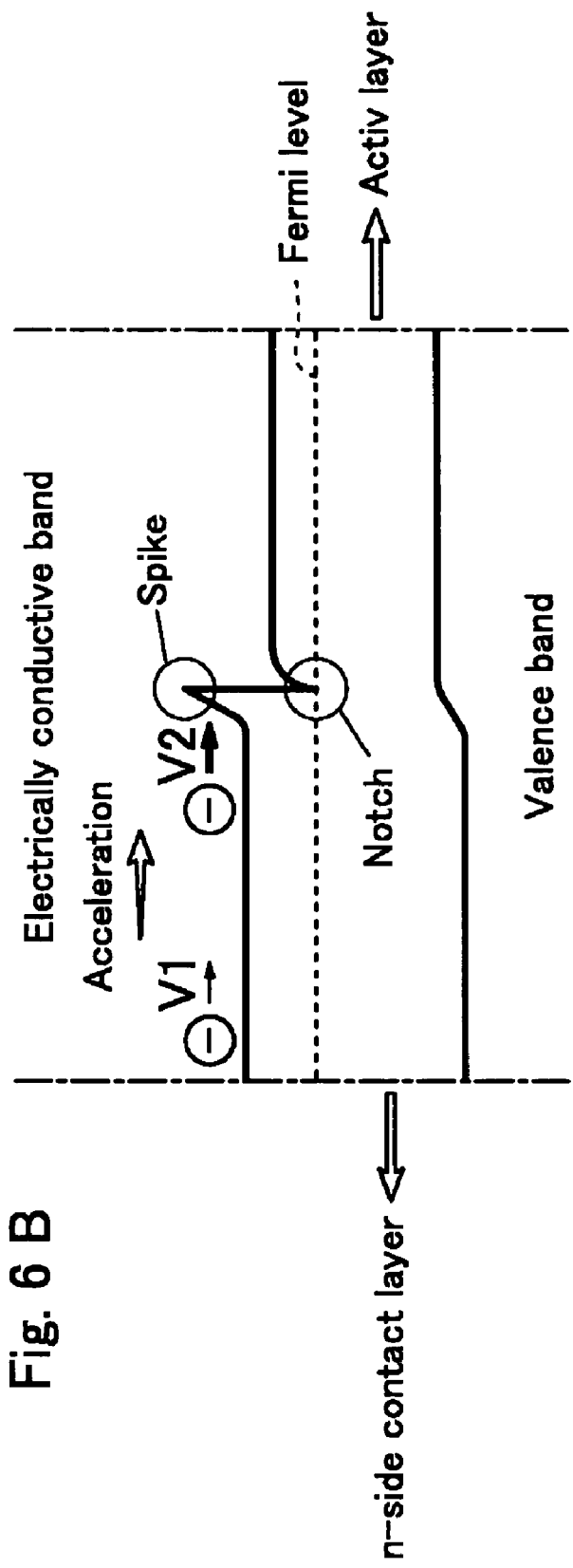
Fig. 6 A
Fig. 6 B

NITRIDE SEMICONDUCTOR DEVICE

BACKGROUND OF THE INVENTION

1. Field of the Invention

The present invention relates to a nitride semiconductor device (for example, $In_aAl_bG_{1-a-b}N$, $0 \leq a$, $0 \leq b$, $a+b \leq 1$) used as a light emitting device or a light receiving device such as light emitting diode (LED), laser diode (LD), solar cell or light sensor, or other electronic devices such as transistor or power device.

2. Description of the Related Art

Nitride semiconductors are used as the material to make, for example, high luminance blue LED or pure green LED, for such applications as full-color LED display, traffic signal light, image scanner or other light sources. Various LED structures are known including that described in Patent Document 1.

[Patent Document 1]

Japanese Unexamined Patent Publication (Kokai) No. 2000-232237

The light emitting devices of the prior art described above are in some cases insufficient in the device characteristics thereof, such as uneven forward voltage (Vf) within a wafer and variability of Vf with the lapse of driving time. Decreasing the mean value of Vf within a wafer and suppressing the variability in the value of Vf enable it to improve the yield of production. Moreover, suppressing the variability of Vf with the lapse of driving time leads to widening of the applicability of the device and improvement of reliability. In case a plurality of LEDs are connected in parallel, for example, when the value of Vf of only some of the LEDs varies with the drive time, such a problem occurs that the LEDs cannot emit light with even luminance.

Moreover, in a nitride semiconductor device having such a structure as an active layer is sandwiched by an n-type semiconductor layer and a p-type semiconductor layer in order to increase the withstanding electrostatic voltage, providing an n-type semiconductor layer that includes an n-type impurity in the n-type semiconductor layer that comprises a plurality of layers decreases the value of Vf, and providing an n-type semiconductor layer, that is doped with a low concentration of n-type impurity or undoped, improves the withstanding electrostatic voltage. The withstanding electrostatic voltage can be improved further by providing the n-type semiconductor layer, that is doped with a low concentration of n-type impurity or undoped, with a larger thickness, although it makes the problem of variability of Vf with the lapse of driving time more conspicuous.

SUMMARY OF THE INVENTION

An object of the present invention is to provide a nitride semiconductor device that solves the problems described above.

The invention according to claim 1 is a nitride semiconductor device comprising an active layer provided between an n-side contact layer that has an n electrode and a p-side contact layer that has a p electrode. The nitride semiconductor device in particular has at least a first n-side layer, a second n-side layer, a third n-side layer and a fourth n-side layer formed in this order from the n-side contact layer between the n-side contact layer and the active layer, while the concentration of n-type impurity in at least the second n-side layer and the fourth n-side layer is higher than the concentration of n-type impurity in the first n-side layer and the third n-side layer.

The invention according to claim 2 is the nitride semiconductor device according to claim 1, wherein the concentration of n-type impurity in the fourth n-side layer is higher than the concentration of n-type impurity in the second n-side layer.

The invention according to claim 3 is the nitride semiconductor device according to claim 1 or 2, wherein a fifth n-side layer is further provided between the fourth n-side layer and the active layer, and the concentrations of n-type impurity in the second n-side layer and in the fourth n-side layer are higher than the concentration of n-type impurity in the fifth n-side layer.

The invention according to claim 4 is the nitride semiconductor device according to claim 3, wherein the concentration of n-type impurity is $1 \times 10^{18}/cm^3$ or less in the first n-side layer, the third n-side layer and the fifth n-side layer.

The invention according to claim 5 is the nitride semiconductor device according to any one of claims 1 to 4 wherein, the thickness of the second n-side layer is smaller than that of the first n-side layer, and the thickness of the fourth n-side layer is smaller than that of the third n-side layer.

The invention according to claim 6 is the nitride semiconductor device according to any one of claims 1 to 5, wherein the first n-side layer and the third n-side layer have substantially the same compositions or the same band gap energy.

The invention according to claim 7 is the nitride semiconductor device according to any one of claims 1 to 6, wherein the second n-side layer and the first n-side layer have, substantially the same compositions or the same band gap energy.

The invention according to claim 8 is the nitride semiconductor device according to any one of claims 1 to 7, wherein the first n-side layer and the third n-side layer have the thickness of 100 nm or larger.

The invention according to claim 9 is the nitride semiconductor device according to any one of claims 1 to 8, wherein the first to third n-side layers are made of GaN.

The invention according to claim 10 is a nitride semiconductor device comprising at least a first n-side layer, a second n-side layer and a third n-side layer formed in this order from the side of an n-side contact layer between the n-side contact layer that has an n electrode and an active layer, wherein the first n-side layer and the second n-side layer are in contact with each other, the second n-side layer includes an n-type impurity, concentration of the n-type impurity in the second n-side layer is higher than the concentration of the n-type impurity in the first n-side layer and in the third n-side layer, the second n-side layer and the first n-side layer have substantially the same compositions or the same band gap energy, and the thickness of the second n-side layer is smaller than those of the first n-side layer and the third n-side layer.

The invention according to claim 11 is the nitride semiconductor device according to claim 10, wherein the first n-side layer and the third n-side layer have substantially the same compositions or the same band gap energy.

The invention according to claim 12 is the nitride semiconductor device according to claim 10 or 11, wherein the first n-side layer has the thickness of 100 nm or larger.

The invention according to claim 13 is the nitride semiconductor device according to any one of claims 10 to 12, wherein the first n-side layer and the second n-side layer are made of GaN.

The invention according to claim 14 is the nitride semiconductor device according to any one of claims 10 to 13, wherein the first to third n-side layers are made of GaN.

The invention according to claim 15 is the nitride semiconductor device according to any one of claims 10 to 14, wherein a fourth n-side layer is provided in contact with the third n-side layer between the third n-side layer and the active layer, while the forth n-side layer includes an n-type impurity, and the fourth n-side layer and the third n-side layer have substantially the same compositions or the same band gap energy.

The invention according to claim 16 is the nitride semiconductor device according to claim 15, wherein the third n-side layer has the thickness of 100 nm or larger.

The invention according to claim 17 is the nitride semiconductor device according to claim 15 or 16, wherein the fourth n-side layer includes an n-type impurity in a concentration higher than the concentration of n-type impurity in the second n-side layer.

The invention according to claim 18 is the nitride semiconductor device according to any one of claims 15 to 17, wherein a fifth n-side layer is provided between the fourth n-side layer and the active layer, and the concentration of the n-type impurity in the fourth n-side layer is higher than the concentration of the n-type impurity in the fifth n-side layer.

The invention according to claim 19 is the nitride semiconductor device according to any one of claims 1 to 18, wherein area of an interface between the first n-side layer and the adjacent layer is 1 mm$^2$ or less.

The invention according to claim 20 is the nitride semiconductor device according to any one of claims 1 to 19, wherein the n-side contact layer has a substrate that is different from the nitride semiconductor on the side of a first principal plane opposite to the active layer, and has a second principal plane that makes an interface with an adjacent nitride semiconductor layer and a third principal plane that has an n electrode located on the side of the substrate away from the second principal plane, while the thickness of the layer between the first principal plane and, the third principal plane is either 3 μm or larger, or within 80% of the thickness of the layer between the first principal plane and the second principal plane.

The constitution of the present invention enables it to obtain a device that has a high withstanding electrostatic voltage and high reliability while variability of Vf with the lapse of driving time is suppressed.

BRIEF DESCRIPTION OF THE DRAWINGS

FIG. 6A is a schematic diagram showing a part of stacking structure of a nitride semiconductor device of the prior art (schematic diagram showing the stacking structure of n-type semiconductor layers of the prior art).

FIG. 6B is a schematic diagram showing the energy band in a part of the stacking structure shown in FIG. 6A.

DESCRIPTION OF THE PREFERRED EMBODIMENTS

Embodiment 1

Figure 1:
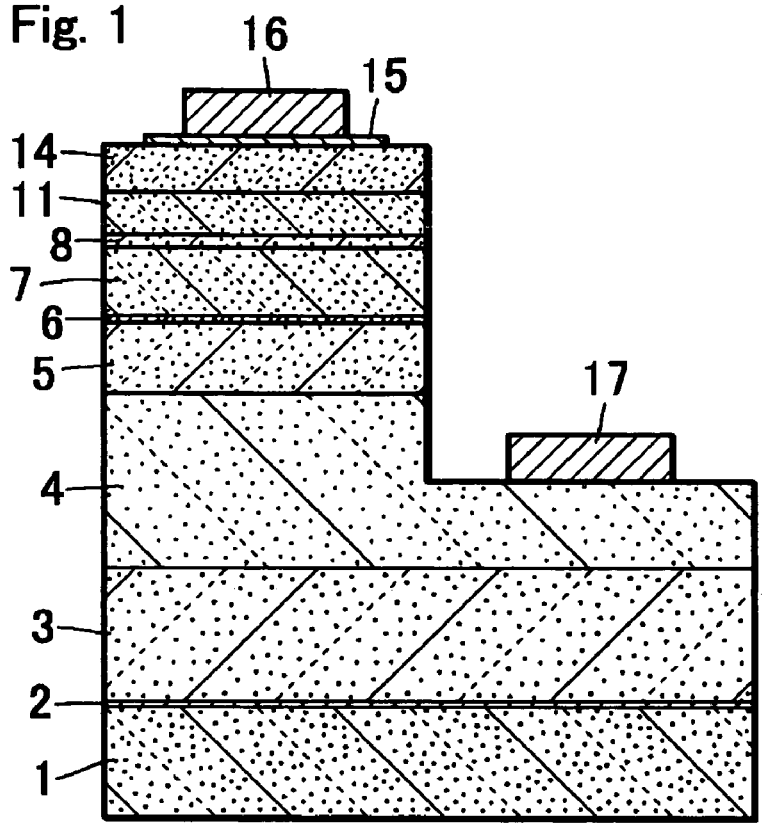
FIG. 1 is a schematic sectional view showing the structure of a nitride semiconductor device according to one example of the present invention.

FIG. 1 is a schematic sectional view showing the structure of a light emitting diode (LED) that is a nitride semiconductor device of the present invention, but the present invention is not limited to this constitution.

FIG. 1 shows the LED having such a structure as a buffer layer 2, a base laser 3, an n-side contact layer 4, a first n-side layer 5, a second n-side layer 6, a third n-side layer 7, a fourth n-side layer 8, an active layer 11 and a p-side contact layer 14 formed in this order on a substrate 1. Embodiment 1 of the present invention is characterized in that concentration of n-type impurity in the second n-side layer and in the fourth n-side layer is higher than the concentration of n-type impurity in the first n-side layer and in the third n-side layer. The n-type impurity of this embodiment is Si. According to the present invention, while carbon (C), silicon (Si), germanium (Ge), tin (Sn), sulfur (S), selenium (Se), Te (tellurium) or the like may be used as the n-type impurity, Si is preferably used in consideration of electrical conductivity.

Since the mean value of Vf (voltage required to have a predetermined current, for example 20 mA, to flow) within a wafer is decreased and the variability in the value of Vf is suppressed by providing the first n-side layer 5, the second n-side layer 6, the third n-side layer 7 and the fourth n-side layer 8 between the n-side contact layer 4 and the active layer 11, number-of chips that can be shipped increases with an improved yield of production. Moreover, as the number of chips that experience a drop in Vf in the early stage of driving decreases, thus resulting in widening of the applications as well as the improvement in the yield of production.

Such a problem can also be solved that, in case a plurality of LEDs are connected in parallel, the value of Vf in only some of the LEDs varies with the drive time. The problem of variability of Vf with the lapse of driving time will be described in more detail below.

In a nitride semiconductor light emitting device having such a structure as an active layer is sandwiched by an n-type nitride semiconductor layer and a p-type nitride semiconductor layer, for example, the light emitting device must have a low value of Vf or a high withstanding electrostatic voltage in order to have good device characteristics. When the n-type nitride semiconductor layer includes an impurity that shows n-type of electrical conductance (n-type impurity), a nitride semiconductor device having a low value of Vf can be obtained. When the n-type nitride semiconductor layer is undoped or includes a low-dose of the n-type impurity, a nitride semiconductor device having a high withstanding electrostatic voltage can be obtained, However, conditions to achieve these effects are contradictory with regard to the concentration of n-type impurity, leading to a problem that an attempt to increase the withstanding electrostatic voltage results in a higher value of Vf. The inventors of the present application assumed that forming the nitride semiconductor layer that includes an n-type impurity in a low concentration with a large thickness causes the variability of Vf with the lapse of driving time to be likely to occur, and completed the present invention that provides a nitride semiconductor device having good electrostatic voltage withstanding characteristic where the variability of Vf with the lapse of driving time is suppressed.

FIG. 6 and FIG. 7 are diagrams explanatory of the nitride semiconductor device of the present invention that has good electrostatic voltage withstanding characteristic where the variability of Vf with the lapse of driving time is suppressed, showing such a structure of the nitride semiconductor device as the stacked semiconductor layers shown in the drawing are sandwiched by the n-side contact layer and the active layer.

Figure 7A:
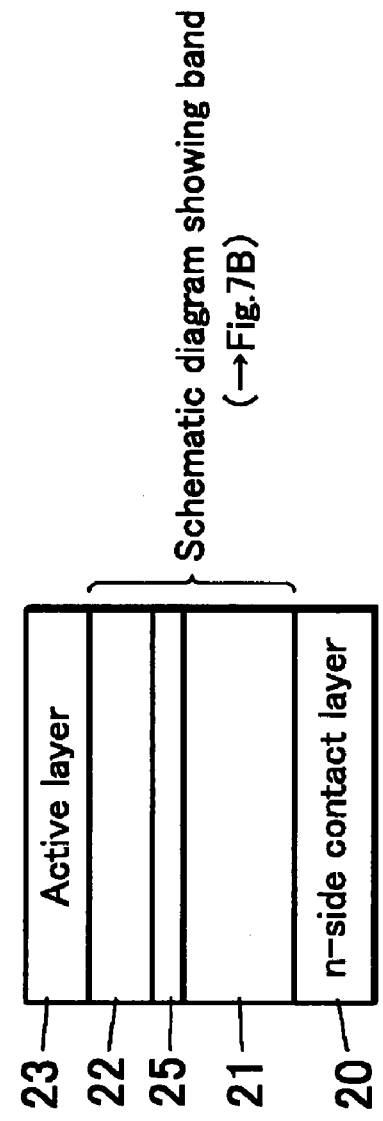
FIG. 7A is a schematic diagram showing a part of stacking structure of a nitride semiconductor device according to Embodiment 1 of the present invention (schematic diagram showing the stacking structure of n-type semiconductor layers according to Embodiment 1 of the present invention).
Figure 7B:
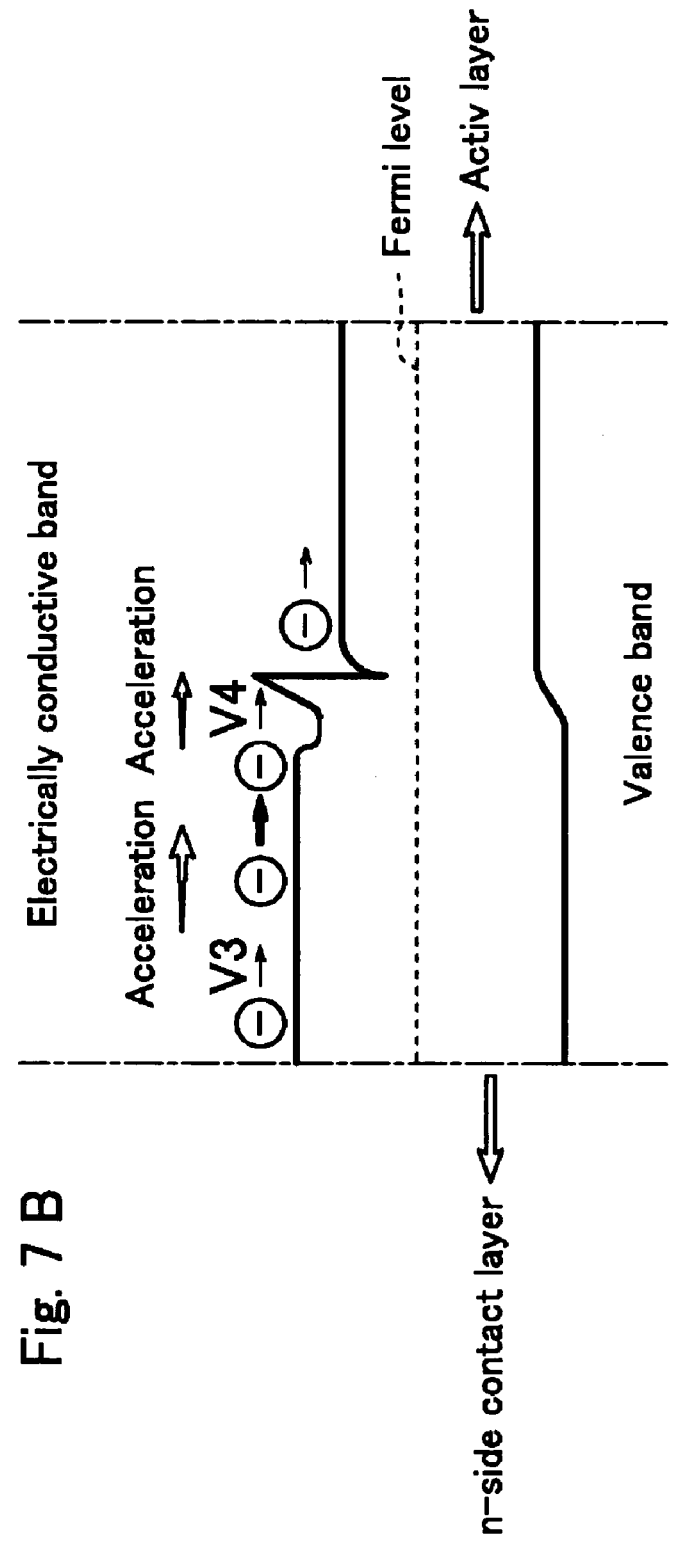
FIG. 7B is a schematic diagram showing the energy band in a part of the stacking structure shown in FIG. 7A.

FIG. 6A schematically shows the stacking structure of the n-type semiconductor layers of the prior art having the effect of improving the electrostatic voltage withstanding characteristic, and FIG. 6B schematically shows the band gap energy of the layers sandwiched between the n-side contact layer 4 and the active layer 11 in the stacking structure shown in FIG. 6A. Between the n-side contact layer, whereon the n electrode is formed, and the active layer, electrons move from the n-side contact layer into the active layer through the n-type nitride semiconductor layers provided between these layers, so that the electrons are injected into the active layer. In the nitride semiconductor light emitting device where the active layer is provided between the n-type nitride semiconductor layer and the p-type nitride semiconductor layer, a band offset is provided at least between the active layer and the layer located outside thereof in order to inject electrons and positive holes efficiently into the active layer. That is, a layer having a band gap energy greater than that of the active layer that has different band gap energy, which results in the appearance of spike and notch in the interface of junction as shown in FIG. 6B. FIG. 6A shows an example where an n-side contact layer 20 made of GaN doped with Si, an undoped GaN layer 21, an InGaN layer 22 (a layer having a band gap energy greater than that of the well layer of the active layer) and an active layer 23 having well layer made of InGaN. FIG. 6B shows the energy band of the undoped GaN layer 21 and the InGaN layer 22 among the layers described above. A light emitting device of good electrostatic voltage withstanding characteristic can be obtained by providing the undoped GaN layer 21. However, since the undoped layer has a high electrical potential energy in contrast to the n-side contact layer and the other layers that are doped with the n-type impurity, electrons move from the n-side contact layer with a high acceleration and the velocity V of the electron movement increases while moving through the layers. That is, the electron that exits from the n-side contact layer and enters the undoped layer with a velocity of V1 exits the undoped layer with a velocity V2, where V1<V2. As the electron that has been accelerated by the undoped layer hits the spike, it imparts a strong impact to the interface. As this impact is repetitively exercised, crystals of the InGaN layer 22 that is a layer of different band gap energy on the active layer side are deteriorated quickly, resulting in a leak current flowing partially in the layer that causes the value of Vf to vary. That is, as the thickness of the undoped layer increases, time required for electron to pass through the layer of high potential energy becomes longer and velocity of the electron movement increases, and therefore this phenomenon becomes more likely to occur. In FIG. 6A, that shows a case where the layer that makes contact with the undoped GaN layer is made of InGaN, it is considered that the phenomenon can occur similarly since spike and notch appear in case the layer that makes contact with the undoped GaN layer has a composition different from that of the undoped layer such as InGaN, or has a nitride semiconductor layer-of different band gap energy, or makes direct contact with the active layer such as the well layer made of InGaN. In order to achieve stable flow of electrons into the active layer, it is preferable to provide some other layer between the layer that includes n-type impurity and the active layer so as to decrease the velocity of electron movement in a layer located away from the active layer, rather than decreasing the velocity of electron movement in a layer located immediately in front of the active layer. In case the undoped layer is made of GaN, for example, the phenomenon can occur similarly in the case of AlGaN layer or InGaN layer (either undoped or doped with an n-type impurity) According to the present invention, the problem can be solved by providing a layer that includes n-type impurity 25 in contact with the undoped layer 21 as schematically shown in FIG. 7. FIG. 7A shows a case where the Si-doped GaN layer 25 is provided between the undoped GaN layer 21 and the InGaN layer 22, in addition to FIG. 6A. FIG. 7B is a schematic diagram showing the energy band in a part of the stacking structure shown in FIG. 7A. As shown in FIG. 6, although spike and notch appear, as the Si-doped GaN layer is provided in contact with the undoped GaN layer, velocity V of the electron movement after passing the undoped layer once decreases thus making it possible to mitigate the impact on the spike. That is, the electron that exits from the n-side contact layer and enters the undoped layer with a velocity of V3 exits the undoped layer with a velocity V4, where V3<V4. However, since a relation of V4<V2 holds in contrast to the conventional structure shown in FIG. 6, the impact on the spike can be made less than that of the prior art. Action of the Si-doped GaN layer (GaN layer that includes the n-type impurity) will be described in more detail. This layer is required to have concentration of n-type impurity higher than that in at least the undoped layer. In such a layer, potential energy decreases to such an extent that is caused by the n-type dopant, thus making it possible to decrease the acceleration of electron without significantly changing the electrostatic voltage withstanding characteristic, namely to decrease the velocity V of the electron movement. This layer, in addition to having higher concentration of n-type impurity than that of the undoped layer, preferably has substantially the same compositions or the same-band gap energy as the undoped layer. This causes the decrease in potential energy for the undoped layer to be caused only by the n-type dopant, thus making it possible to decrease the acceleration of electron without significantly changing the electrostatic voltage withstanding characteristic. In addition, this constitution is preferable also because lattice matching of the two layers becomes better and semiconductor layers of better crystallinity can be formed. That is, the nitride semiconductor device having higher withstanding electrostatic voltage while the variability of Vf, with the lapse of driving time is suppressed can be obtained.

The undoped layer may not necessarily be undoped, but may include the impurity as long as the concentration is low enough to make a device having high withstanding electrostatic voltage, specifically concentration of n-type impurity is preferably $1 \times 10^{18}/cm^3$ or less.

The concentration of n-type impurity of the layer that includes n-type impurity that makes contact with the undoped layer on the active layer side is higher than at least that in the adjacent undoped layer, and $5 \times 10^{17}/cm^3$ or more, preferably $1 \times 10^{18}/cm^3$ or more and more preferably $5 \times 10^{18}/cm^3$ or more, so as to decrease the velocity V of the electron movement and suppress the variability of Vf with the lapse of driving time. In addition, it is preferable that the layer that includes n-type impurity has concentration of n-type impurity substantially equal to or lower than that of the n-side contact layer. When the layer that includes n-type impurity has concentration of n-type impurity higher than that of the n-side contact layer, supply of electron from this layer into the active layer becomes predominant, thus making the adjacent undoped layer and the other layers unable to function satisfactorily.

Figure 8:
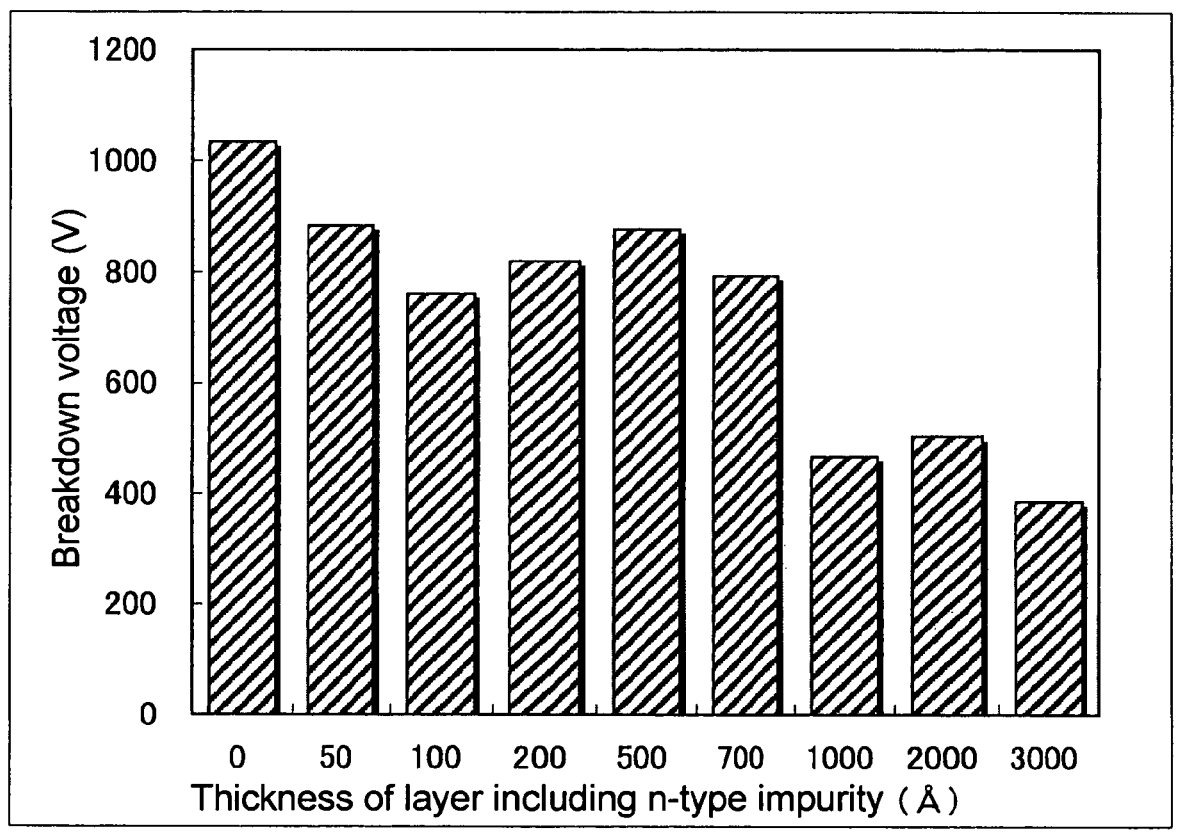
FIG. 8 is a diagram showing the breakdown-voltage changing with the layer thickness of the layer including n-type impurity according to one embodiment of the present invention.

With regard to the relation of the thickness between the undoped layer and the layer that includes the n-type impurity, the undoped layer is preferably thicker than the layer that includes n-type impurity that adjoins the active layer, which enables it to obtain a device having higher withstanding electrostatic voltage. The thickness of the layer that includes n-type impurity is preferably 100 nm or less. When the thickness of the layer that includes n-type impurity is larger than 100 nm, withstanding electrostatic voltage in the forward and reverse directions, particularly in the reverse direction decreases and the adjacent undoped layer cannot improve the electrostatic voltage withstanding characteristic of the nitride semiconductor device. FIG. 8 shows the breakdown voltage (unit: volt) changing with the thickness (unit: angstrom) of the layer including Si (the second layer) in a 3-layer structure comprising a first layer made of undoped GaN (1500 Å), a second layer made of GaN including $5 \times 10^{17}/cm^3$ or of Si and a third layer made of undoped GaN (1500 Å), formed in this order from below in a minimum constitution including a base layer made of undoped GaN (3000 Å) provided on the n side, in a stacking structure B to be described later. When the thickness of the layer that includes n-type impurity is larger than 100 nm, breakdown voltage decreases sharply and the withstanding electrostatic voltage decreases significantly. Lower limit of the thickness of the layer that includes n-type impurity is 1 nm. When the thickness is 1 nm or larger, value of Vf tends to decrease within a wafer and the layer has a favorable effect of at least decreasing the velocity V of electron movement.

Figure 9:
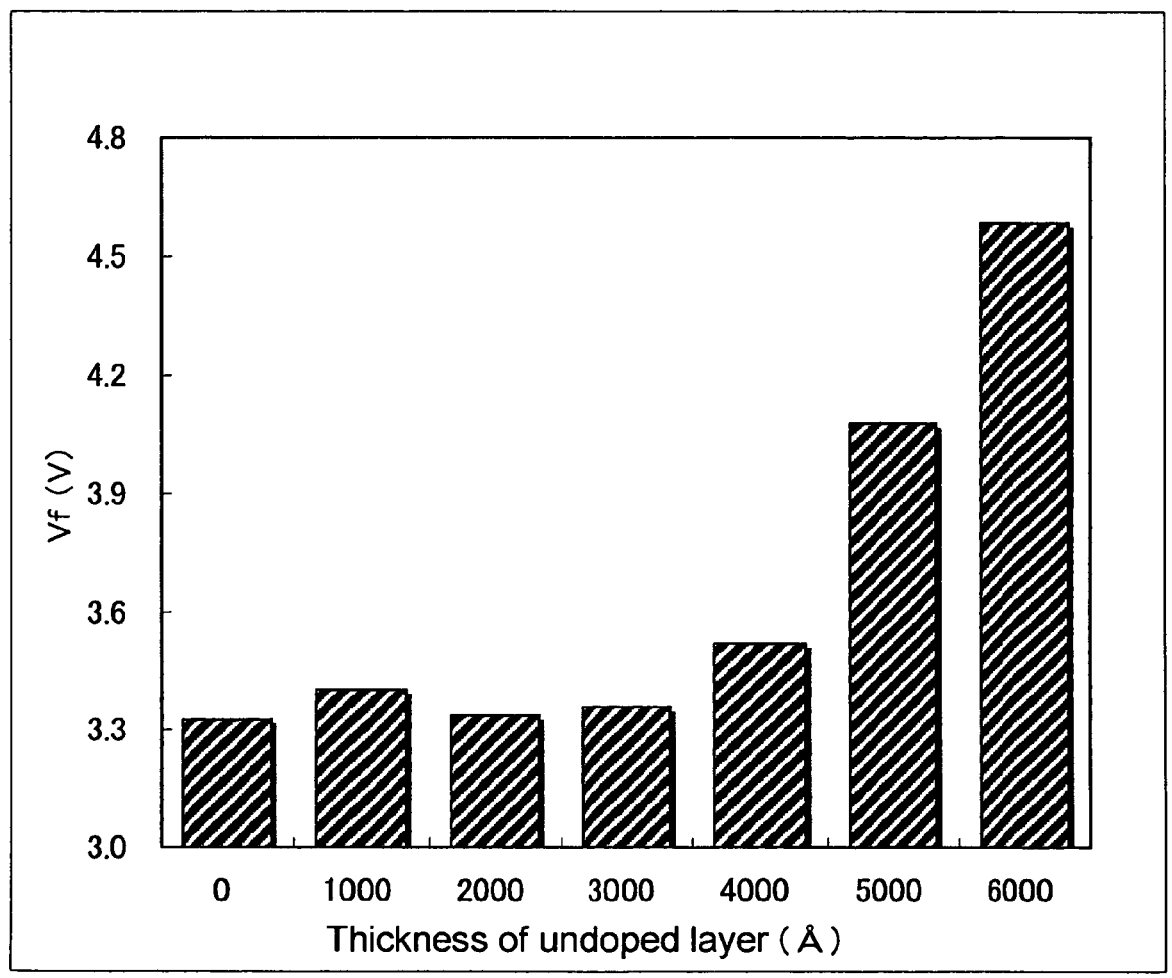
FIG. 9 is a diagram showing the value of Vf changing with the layer thickness of an undoped layer according to one embodiment of the present invention.

The thickness of the undoped layer is preferably 100 nm or larger. When the thickness of the undoped layer is preferably 100 nm or larger, the nitride semiconductor device having good electrostatic voltage withstanding characteristic can be made. Upper limit of the thickness of the undoped layer is 500 nm. When the thickness is larger than 500 nm, value of Vf increases sharply which is not desirable. FIG. 9 shows the value of Vf (unit: volt) changing with the thickness (unit: angstrom) of the undoped layer (the first layer) in a 3-layer structure comprising a first layer made of undoped GaN (1500 Å), a second layer made of GaN including $5 \times 10^{17}/cm^3$ of Si (100 Å) and a third layer made of undoped GaN (1500 Å) formed in this order from below in a minimum constitution including a base layer made of undoped GaN (3000 Å) provided on the n side, in the stacking structure B to be described later. When the thickness of the undoped layer is larger than 500 nm, value of Vf increases sharply.

The constitution described above is the minimum constitution of the two adjacent layers provided between the n-side contact layer and the active layer, which makes the main feature of the present invention.

In the nitride semiconductor device that has the minimum constitution between the n-side contact layer and the active layer, the area of the interface between the undoped layer and the adjacent layer of the minimum constitution is preferably 1 mm² or less. In Embodiment 1, surface area of the first n-side layer or the third n-side layer is preferably 1 mm² or less. The variability of Vf with the lapse of driving time, that is the subject of the present invention, is a problem that can occur particularly in a nitride semiconductor device where surface area of the interface of the undoped layer is small, namely the number of electrons per unit area is large, because electrons supplied from the n-side contact layer continually impart impacts to the spike. That is, when surface area of the interface of the undoped layer is smaller, the minimum constitution provided in the present invention suppresses the variation in Vf more effectively. The nitride semiconductor device is made by forming the nitride semiconductor layers one on another on a 3-inch sapphire substrate, a 2-inch GaN substrate or a 6-inch SiC substrate and separating the nitride semiconductor wafer into chips of various areas. In case the surface area of the chip is less than 1 mm², a larger number of electrons flow from the n-side contact layer to the active layer, thus resulting in conspicuous variation in the value of Vf due to increased number of impacts to the spike, although variation of Vf can be suppressed in a device having the minimum constitution of the present invention. This applies also to a nitride semiconductor device having an electrically conductive substrate made of Si, SiC, GaN or the like provided with an n electrode on the substrate, and to a nitride semiconductor device having insulating substrate such as sapphire or the like provided with an n electrode on the same side as a p electrode.

Moreover, in a nitride semiconductor device that uses an insulating substrate such as sapphire, the p electrode and the n electrode are provided on the same surface, so that the surface where the n-side contact layer is joined to the nitride semiconductor layer on the active layer side and the surface where the n electrode is formed are usually different in height. Electrons injected through the electrode move through the n-side contact layer horizontally in parallel to the layer, then move vertically in the direction of stacking layers toward the active layer. Therefore, it is supposed that both the severity and the number of impacts on the spike vary depending on the height difference between the surface where the n-side contact layer is joined to the nitride semiconductor layer on the active layer side and the surface where the n electrode is formed, and on the thickness of n-side contact layer through which electrons pass.

Figure 10:
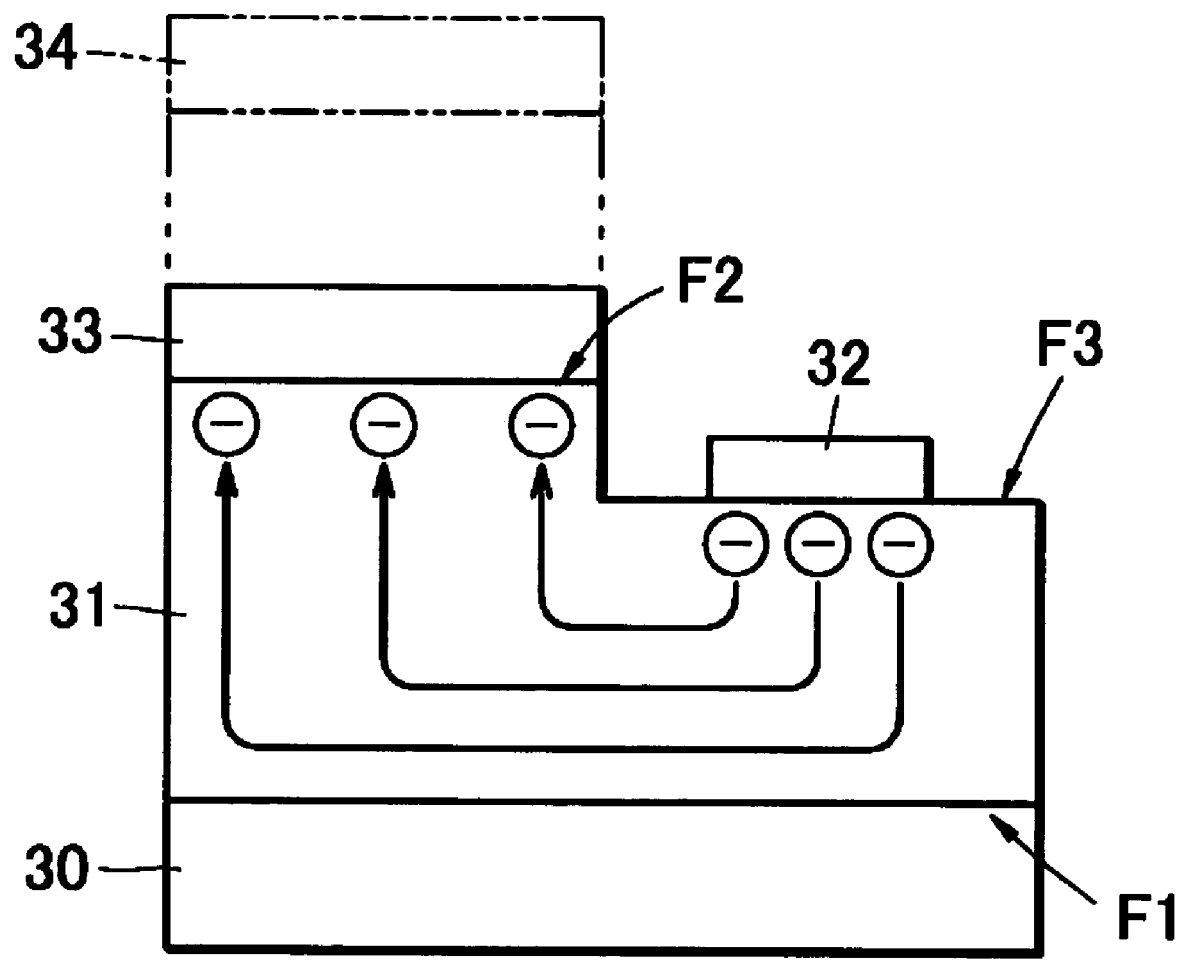
FIG. 10 is a diagram explanatory of the features of the present invention.

In the nitride semiconductor device wherein area of an interface between the undoped layer and the adjacent layer of the minimum constitution is 1 mm$^2$ or less, the n-side contact layer has an insulating substrate on the first principal plane side opposite to the active layer, and has a second principal plane that forms the interface with the adjacent nitride semiconductor layer on the active layer side and a third principal plane having the n electrode on the side nearer to the substrate than the second principal plane. While a larger number of electrons flow from the n-side contact layer to the active layer, thus resulting in conspicuous variation in the value of Vf due to increased number of impacts to the spike when the thickness of the layer between the first principal plane and the third principal plane is either 3 μm or larger, or within 80% of the thickness of the layer between the first principal plane and the second principal plane, variation of Vf can be suppressed in a device having the minimum constitution of the present invention. FIG. 10 is a diagram explanatory of the relationship between the first principal plane (F1), the second principal plane (F2) and the third principal plane (F3) in the n-side contact layer (31) that has an insulating substrate on the substrate of different kind (30). When the thickness of the layer between the first principal plane (F1) and the third principal plane (F3) is 3 μm or larger, since electrons injected from the n electrode (32) into the n-side contact layer (31) move vertically deep toward the substrate of different kind (30), time of horizontal movement also becomes longer and the electrons reach the interface of the n-side contact layer that is located away from the n electrode (32). When the thickness of the layer between the first principal plane (F1) and the third principal plane (F3) is within 80% of the thickness of the layer between the first principal plane (F1) and the second principal plane (F2), difference in height between the second principal plane (F2) and the third principal plane (F3) becomes larger, so that electrons injected from the n electrode into the n-side contact layer move horizontally. Since the distance to the interface of the n-side contact layer (where the undoped nitride semiconductor layer (33) is in contact with the n-side contact layer on the active layer (34) side) is large, the electrons continue to move horizontally, and reach the interface of the n-side contact layer that is located away from the n electrode also in this case. That is, in these ranges, since the region having much electrons per unit area extends over the entire interface between the undoped layer and the adjacent layer in the minimum constitution, variability in Vf due to the impact on the spike appear most conspicuously compared to a nitride semiconductor device that has a region that includes much electrons only on the n electrode side of the interface, although variability of Vf can be suppressed in a device having the minimum constitution of the present invention.

The structure having the minimum constitution that consists of the undoped layer and the layer including the n-type impurity may be provided in plurality between the n-side contact layer and the active layer, which results in higher withstanding electrostatic voltage and suppressed variability in Vf. However, too many of this structure tend to result in lower crystallinity and lower efficiency of light emission, and therefore it is preferable to set a certain limit to the number.

The structure of Embodiment 1 described above includes two sets of the minimum constitution, where the first and third n-side layer correspond to the undoped layer or the layer that includes n-type impurity with concentration of $1\times10^{18}/cm^3$ or less, and the second and fourth n-side layers correspond to the adjacent layer that includes n-type impurity, while the first n-side layer and the second n-side layer make up the minimum constitution, or the third n-side layer and the fourth n-side layer make up the minimum constitution.

Various embodiments may be conceived for the minimum constitution and the nitride semiconductor device that has the minimum constitution. Preferable embodiments for the minimum constitution and the nitride semiconductor device that has the minimum constitution will now be described in detail.

Components that constitute the nitride semiconductor device shown in FIG. 1 as Embodiment 1 will be described below.

(Substrate 1)

The substrate 1 may be made of an insulating material such as sapphire or spinel (MgAl$_{12}$O$_4$) having principal plane in C plane, R plane or A plane, or a semiconductor such as SiC (including 6H, 4H, 3C), Si, ZnO, GaAs, GaN. The substrate 1 may be removed at the end.

(Buffer Layer 2)

The buffer layer 2 is made of a nitride semiconductor, for example AlGaN (including GaN), where the proportion of Al is preferably 0.3 or less, and more preferably 0.2 or less. The buffer layer 2 may be removed at the end, or may be omitted altogether.

(Base Layer 3)

While there is no restriction on the composition of the base layer 3, it is preferably made of AlGaN with the proportion of Al being 0.2 or less, and more preferably made of GaN, which enables it to obtain a nitride semiconductor layer having less crystal defects. The base layer 3 may be removed at the end, or may be omitted altogether.

(n-side Contact Layer 4)

While there is no restriction on the composition-of the n-side contact layer 4, it is preferably made of AlGaN with the proportion of Al being 0.2 or less, and more preferably made of GaN, which enables it to obtain a nitride semiconductor layer having less crystal defects. While there is not restriction on the thickness of the layer, it is preferably grown to the thickness not less than 1 μm, since the n electrode is to be formed on the layer.

There is no restriction on the n electrode used in the present invention, and an electrode known in the prior art may be used, such as the electrode described in examples.

(First n-side Layer 5)

The first n-side layer 5 is preferably made of AlGaN with the proportion of Al being 0.2 or less, or InGaN with the proportion of In being 0.1 or less, and more preferably made of GaN, which enables it to obtain a nitride semiconductor layer having less crystal defects. While the first n-side layer 5 to the fourth n-side layer 8 may have different compositions, these layers are preferably made in the same composition and more preferably made of GaN. When the first n-side layer and the third n-side layer are made of GaN, both layers satisfactorily contribute to the improvement of the withstanding electrostatic voltage of the nitride semiconductor device, and the layer that includes the n-type impurity and has good crystallinity can be obtained by making the second n-side layer and the fourth n-side layer from GaN.

The withstanding electrostatic voltage can be improved by providing the third n-side layer 7. The third n-side layer 7 may have concentration of n-type impurity lower than that of the second n-side layer, or $1 \times 10^{18}/cm^3$ or less, preferably $5 \times 10^7/cm^3$ or less, and more preferably $1 \times 10^{17}/cm^3$ or less. These ranges of concentration of n-type impurity include undoped composition. Thus the effect described above becomes more conspicuous as the concentration of the n-type impurity becomes lower (the concentration of n-type impurity approaches zero).

In the present invention, the term "undoped" indicates a state of a layer that is not intentionally doped with an impurity. When a layer includes an impurity mixed therein through diffusion from the adjacent nitride semiconductor layer, it is called undoped in the present invention, if it is grown without doping an impurity. An impurity mixed through diffusion often has a gradient in the concentration thereof within a layer.

The thickness of the first n-side layer 5 is 100 Å or more, preferably in a range from 100 to 5000 Å, and more preferably in a range from 1000 to 3000 Å. When the thickness is less than 100 Å, yield of production tends to decrease as the withstanding electrostatic voltage decreases. When the thickness is more than 5000 Å, value of Vf is likely to increase. The electrostatic voltage withstanding characteristic can be improved and variability of Vf with the lapse of driving time can be suppressed by the relation between the layer having the thickness in a range from 1000 to 3000 Å and the layer that includes n-type impurity (the second layer).

(Second n-side Layer 6)

Providing the second n-side layer 6 doped with the n-side impurity enables it to significantly decrease the mean value and reduce the variability of Vf within a wafer. The number of LED chips that have lower value of Vf in the early stage of driving can also be decreased. As the layer is in contact with the first n-side layer, velocity of electron that has been accelerated can be decreased temporarily.

The second n-side layer preferably has substantially the same compositions or the same band gap energy as the first n-side layer. This causes the decrease in potential energy for the first n-side layer to be caused only by the n-type dopant (n-type impurity), thus making it possible to decrease the acceleration of electron without significantly changing the-electrostatic voltage withstanding characteristic. It is most preferable that the first n-side layer and the second n-side layer are both made of GaN.

The concentration of n-type impurity in the second n-side layer is higher than at least the concentration of n-type impurity of the first n-side layer, $5 \times 10^{17}/cm^3$ or higher, preferably $1 \times 10^{18}/cm^3$ or higher, and more preferably $5 \times 10^{18}/cm^3$ or higher, in order to achieve the effect described above more markedly. The thickness of the second n-side layer 6 is in a range from 10 to 1000 Å, preferably in a range from 30 to 500 Å and more preferably in a range from 50 to 200 Å. When the thickness is larger than 1000 Å, withstanding electrostatic voltage in the forward and reverse directions, particularly in the reverse direction significantly decreases. When the thickness is less than 10 Å, on the other hand, mean value of Vf may not decrease within the wafer.

(Third n-side Layer 7)

The withstanding electrostatic voltage can be improved by providing the third n-side layer 7. The third n-side layer 7 may have concentration of n-type impurity lower than that of the second n-sdei layer, or $1 \times 10^{18}/cm^3$ or less, preferably $5 \times 10^{17}/cm^3$ or less, and more preferably $1 \times 10^{17}/cm^3$ or less. These ranges of concentration of n-type impurity include undoped composition. Thus the effect described above becomes more conspicuous as the concentration of the n-type impurity becomes lower (the concentration of n-type impurity approaches zero).

The thickness of the third n-side layer 7 is 100 Å or more, preferably in a range from 100 to 5000 Å, and more preferably in a range from 1000 to 5000 Å. When the thickness is less than 100 Å, yield of production tends to decrease as the withstanding electrostatic voltage decreases. When the thickness is more than 5000 Å, value of Vf is likely to increase. The electrostatic voltage withstanding characteristic can be improved and variability of Vf with the lapse of driving time can be suppressed by the relation between the layer having the thickness in a range from 1000 to 3000 Å and the layer that includes n-type impurity (the fourth layer). It is supposed that such effects are obtained by the synergy of the third n-side layer 7 and the first n-side layer 5, although detailed explanation is not yet known.

(Fourth n-side Layer 8)

The Fourth n-side layer 8 that is doped with the n-side impurity exerts a relatively great influence on the light emission output power with a sufficient level of carrier concentration. The third n-side layer can function favorably to increase the withstanding electrostatic voltage in this embodiment provided with the third layer. That is, since the layer is in contact with the third n-side layer, it can decrease the velocity of electron that has been accelerated again in the third n-side layer. Light emission output power tends to decrease significantly unless this layer is formed.

The fourth n-side layer preferably has substantially the same compositions or the same band gap energy as the third n-side layer. This causes the decrease in potential energy for the third n-side layer to be caused only by the n-type dopant (n-type impurity), thus making it possible to decrease the acceleration of electron without significantly changing the electrostatic voltage withstanding characteristic. It is most preferable that the third n-side layer and the fourth n-side layer are both made of GaN.

The thickness of the fourth n-side layer 8 is 10 Å or more, preferably in a range from 100 to 1000 Å, more preferably in a range from 100 to 500 Å and further more preferably in a range from 200 to 500 Å. When the thickness is less than 10 Å, the withstanding electrostatic voltage tends to decrease significantly and mean value of Vf may not decrease within the wafer. When the thickness is larger than 1000 Å, light emission output power is likely to decrease.

The concentration of n-type impurity in the fourth n-side layer 8 is higher than at least the concentration of n-type impurity of the third n-side layer 7, preferably $1 \times 10^{18}/cm^3$ or higher, and more preferably $5\times10^{18}/cm^3$ or higher, in order to achieve the effect described above more markedly.

Further, the concentration of n-type impurity in the fourth n-side layer 8 is preferably higher than the concentration of n-type impurity in the second n-side layer 6. In case a plurality of the minimum constitutions (two minimum constitutions of the first and second n-side layers and the third and fourth n-side layers in this embodiment) are provided, the layer that includes n-type impurity preferably has higher concentration of n-type impurity on the side nearer to the active layer in the minimum constitution. This makes it possible to combine the two characteristics of light emission output power and the withstanding electrostatic voltage (particularly in the reverse direction).

A fifth n-side layer may also be provided between the fourth n-side layer and the active layer, although not shown. The fifth n-side layer is preferably formed so that the concentration of n-type impurity in the second n-side layer and in the fourth n-side layer is higher than the concentration of n-type impurity in the fifth n-side layer, and it is more preferable that the fifth n-side layer has concentration of n-type impurity of $1\times10^{18}/cm^3$ or less. When the thickness of the fifth n-side layer is set smaller than those of at least the first n-side layer and the third n-side layer and less than 100 nm, the first and third n-side layers function favorably for the improvement of the electrostatic voltage withstanding characteristic in the case of providing the first to fifth n-side layers, while the second n-side layer and the fourth n-side layer function favorably to decrease the velocity of electron movement and suppress variability of Vf with the lapse of driving time. Lower limit of the thickness of the fifth n-side layer is 1 nm. When the thickness is not less than 1 nm, more conspicuous effects described above can be obtained from the device having the first to fifth n-side layers. Upper limit of the thickness is 100 nm. When the thickness is 100 nm or less, the first n-side layer and the second n-side layer, furthermore the third n-side layer and the fourth n-side layer can achieve the effects of the present invention.

An n-side multi-layer film of the next super lattice structure may be provided between the fifth n-side layer and the active layer, although not shown. Providing the n-side multi-layer film of super lattice structure enables it to increase the light emission output power further. The n-side multi-layer film may consist of two or more kinds of nitride semiconductor having different compositions, and preferable composition is AlGaN (including GaN), where the proportion of Al is 0.1 or less, or InGaN where the proportion of In is 0.1 or less. While there is no restriction on the thickness of component layers that constitute the n-side multi-layer film of super lattice structure, it is preferably 100 Å or less, more preferably 70 Å or less and further more preferably 50 Å or less. This tends to increase the output power. While the component layers that constitute the n-side multi-layer film of super lattice structure may be either undoped or doped with the n-type impurity, it is preferable that all the component layers are undoped.

(Active Layer 11)

The active layer 11 is preferably formed in single quantum well structure (SQW) or multiple quantum well structure (MQW). In case the active layer 11 has MQW, there is no restriction on the order of stacking the layers, which may be stacked starting with the well layer or a barrier layer, and may end with the well layer or a barrier layer, and may.

(P-side Contact Layer 14)

While there is no restriction on the composition of the p-side contact layer 14, it is preferably made of GaN, AlGaN with the proportion of Al being 0.2 or less, or InGaN with the proportion of In being 0.2 or less may be employed, but is more preferably made of GaN, which enables it to obtain better ohmic contact with the p electrode material. There is no restriction on the p electrode used in the present invention, and electrodes made of ITO known in the prior art or the electrodes described in the examples of the invention can be used.

Embodiment 2

Embodiment 2 has the third n-side layer provided on the side located nearer to the active layer than the second n-side layer, in addition to the minimum constitution shown in Embodiment 1, where the third n-side layer is thicker than the second n-side layer and has concentration of n-type impurity lower than that of the second n-side layer. The nitride semiconductor device has such a stacking structure consisting of minimum structure that comprises the first n-side layer and the second n-side layer located in contact with each other between the n-side contact layer and the active layer, and the third n-side layer provided on the side nearer to the active layer than the second n-side layer.

By providing the third n-side layer included in the minimum constitution of Embodiment 2, the second n-side layer is caused to be located away from the active layer. The first n-side layer and the second n-side layer increase the withstanding electrostatic voltage, and are capable of increasing the withstanding electrostatic voltage of the nitride semiconductor device where the variability of Vf with the lapse of driving time is suppressed further. That is, the layer of which electrostatic voltage withstanding characteristic is to be improved (specifically, an undoped layer or a layer having concentration of n-type impurity is $1\times10^{18}/cm^3$ or less) can be provided with an quasi larger thickness, by interposing the second n-side layer that decreases the velocity of electron movement between the first n-side layer and the third n-side layer that can increase the withstanding electrostatic voltage. The second n-side layer (the layer that includes n-type impurity) can be located away from the active layer. As a result, it is preferable to decrease the velocity of electron movement in the layer (the second n-side layer) located away from the active layer, which causes stable flow of electrons into the active layer.

The first to third n-side layers of Embodiment 2 will be described in detail. The first n-side layer and the second n-side layer correspond to the undoped layer and the layer that includes n-type impurity, respectively, shown in Embodiment 1.

Figure 11:
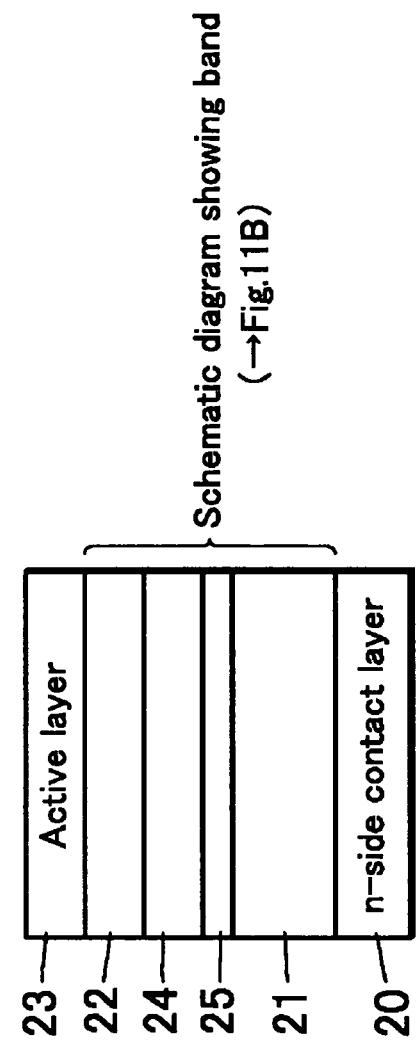
FIG. 11A is a schematic diagram showing a part of stacking structure of a nitride semiconductor device according to Embodiment 2 of the present invention (schematic diagram showing the stacking structure of n-type semiconductor layers according to Embodiment 2 of the present invention).
FIG. 11B is a schematic diagram showing the energy band in a part of the stacking structure shown in FIG. 11A.
Figure 11:
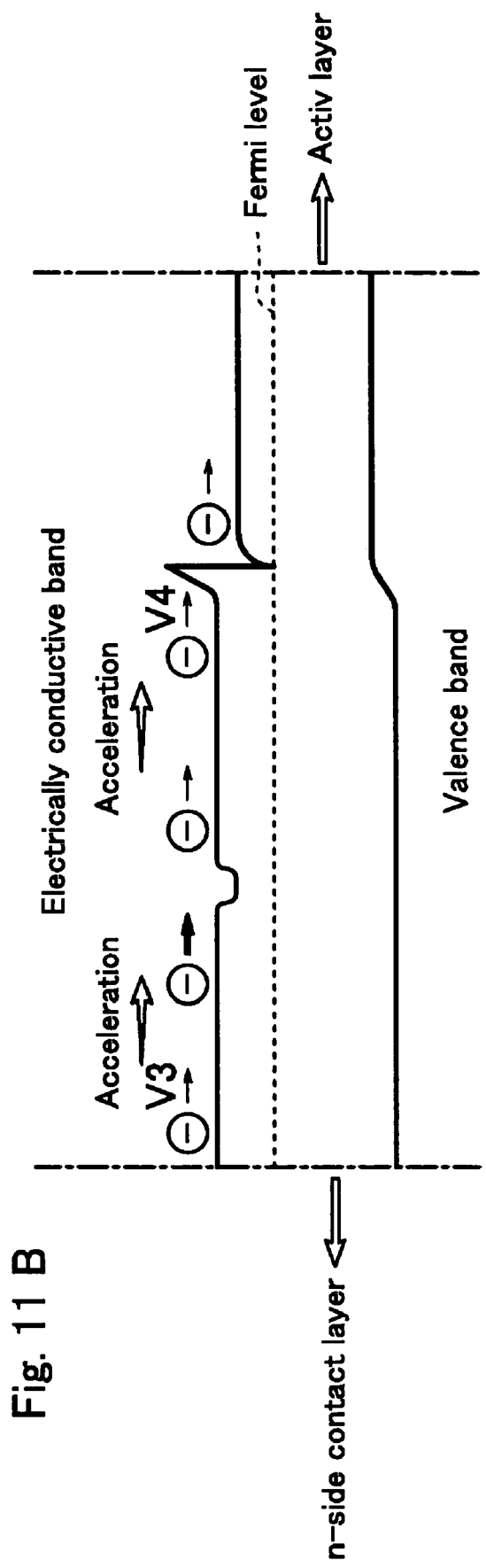

The third n-side layer corresponds to the undoped layer shown in Embodiment 1. The third n-side layer is also preferably located in contact with the second n-side layer, and preferably has substantially the same compositions or the same band gap energy as the first n-side layer. This causes both the first n-side layer and the third n-side layer to function favorably to improve the electrostatic voltage withstanding characteristic. When the band gap energy of either one of the layers is small, unbalance is caused that makes it unable to achieve sufficient effect of maintaining the withstanding electrostatic voltage in a layer that has smaller band gap energy. Both the first n-side layer and the third n-side layer are preferably made of GaN. Forming all the first n-side layer, the second n-side layer and the third n-side layer from GaN causes the decrease in potential energy for the first n-side layer to be caused only by the n-type dopant (n-type impurity), thus making it possible to decrease the acceleration of electron without significantly changing the electrostatic voltage withstanding characteristic, and further improve the electrostatic voltage withstanding characteristic by the first n-side layer in the third n-side layer. Embodiment 2 is the nitride semiconductor device having the minimum constitution that comprises the first n-side layer to the third n-side layer. This is graphically explained in FIG. 11. FIG. 11A schematically shows an example of the structure where the layer that includes n-type impurity (the second n-side layer) is provided in contact with the undoped layer (the first n-side layer) and the undoped layer (the third n-side layer) is provided in contact with the layer that includes n-type impurity, in the case shown in the figure, between the layer that includes n-type impurity (the second n-side layer) and the active layer. By providing the first n-side layer to the third n-side layer as described above, problems similar to those of the conventional structure shown in FIG. 6 can be solved. FIG. 11A shows such a constitution as Si-doped GaN layer and undoped GaN layer are provided between the undoped GaN layer and the InGaN layer in addition to the constitution shown in FIG. 6A. FIG. 11B is a schematic diagram showing the energy band in a part of the stacking structure shown in FIG. 11A. By providing the third n-side layer (specifically an undoped layer or a layer that has concentration of n-type impurity of $1\times10^{18}/cm^3$ or less) in addition to the structure provided with the first n-side layer and the second n-side layer shown in Embodiment 1, it is made possible to locate the layer that includes n-type impurity away from the active layer and provide a layer that increases the withstanding electrostatic voltage with quasi large thickness.

In Embodiment 2, it is preferable to provide the fourth n-side layer in contact with the third n-side layer on the active layer side, and it is characterized in that the fourth n-side layer includes the n-type impurity (the concentration of n-type impurity higher than that of at least the third n-side layer, preferably concentration of n-type impurity of $5\times10^{17}/cm^3$ or higer) and has substantially the same compositions or the same band gap energy as the third n-side layer. By providing the fourth n-side layer as described above, it is made possible to decrease the velocity of electron movement in the fourth n-side layer after being accelerated in the third n-side layer. That is, the third n-side layer not only forms the minimum constitution with the first n-side layer and the second n-side layer, but also forms the minimum constitution that is shown in Embodiment 1 with the third n-side layer and the fourth n-side layer.

In case the fourth n-side layer is provided, concentration of n-type impurity in the fourth n-side layer is preferably higher than the concentration of n-type impurity in the second n-side layer. While there are two layers that include the n-type impurity, namely the second n-side layer and the fourth n-side layer, it is preferable to increase the concentration of n-type impurity in the layer that is located nearer to the active layer. This makes it possible to combine the two characteristics of light emission output power and the withstanding electrostatic voltage (particularly in the reverse direction).

Also in Embodiment 2, the fifth n-side layer may be provided between the fourth n-side layer and the active layer. The fifth n-side layer is preferably provided so that the concentration of n-type impurity in the second n-side layer and in the fourth n-side layer are higher than the concentration of n-type impurity in the fifth n-side layer, and concentration of n-type impurity in the fifth n-side layer is preferably $1\times10^{18}/cm^3$ or less. The thickness of the fifth n-side layer is made smaller than at least the thickness of the first n-side layer and the third n-side layer and smaller than 100 nm, so that the first n-side layer and the third n-side layer can function favorably to improve the electrostatic voltage withstanding characteristic in the constitution provided with the first to the fifth n-side layers, and the second n-side layer and the fourth n-side layer function favorably to decrease the velocity of electron movement and suppress the variability of Vf with the lapse of driving time. Lower limit of the thickness of the fifth n-side layer is 1 nm. When the thickness is not less than 1 nm, more conspicuous effects described above can be obtained from the device having the first to fifth n-side layers. Upper limit of the thickness is preferably 100 nm. When the thickness is not larger than 100 nm, the first and the second n-side layers and the third and the fourth n-side layers can fully achieve the effects of the present invention.

In addition, an n-side multi-layer film of the next super lattice structure may be provided between the fifth n-side layer and the active layer, although not shown. Providing the n-side multi-layer film of super lattice structure enables it to increase the light emission output power further. Details of the n-side multi-layer film are similar to Embodiment 1.

In Embodiment 2, too, a plurality of the structures comprising the first n-side layer, the second n-side layer and the third n-side layer may be provided between the n-side contact layer and the active layer. Although providing a plurality of the structures enables it to obtain a device having increased the withstanding electrostatic voltage and suppressed variation in Vf, too many structures may cause poor crystallinity and lower efficiency of light emission. Therefore, an appropriate number of the minimum constitutions should be provided.

Embodiment 1 and Embodiment 2 have been described. There are no restriction on the structure of the nitride semiconductor device other than those described above, although the substrate, the n-type nitride semiconductor layer, the active layer, the p-type nitride semiconductor layer, the n electrode and the p electrode, and the structures thereof are necessary to obtain the nitride semiconductor device. Preferred embodiments of these structures will now be described.

There is no restriction on the substrate, which is required only to allow semiconductor layers to be formed thereon. As a substrate used to grow the stacking structure, especially epitaxial growth, an insulating substrate such as sapphire or spinel ($MgAl_2O_4$) having principal plane in C plane, R plane or A plane, or SiC (including 6H, 4H, 3C), ZnS, ZnO, GaAs, Si or an oxide substrate that matches with the lattice of the nitride semiconductor, or a substrate made of nitride semiconductor such as GaN or AlN may be used. Among these, a substrate made of sapphire or spinel is preferably used. Further among these substrates, in the case of a material that has a refractive index different from that of nitride semiconductor, it is preferable that the surface of the substrate whereon the nitride semiconductor is to be grown has recesses and protrusions. When the interface between the substrate and the nitride semiconductor layer has recesses and protrusions, light emitted from the light emitting layer can be extracted efficiently from the nitride semiconductor device. The recesses and protrusions are preferably formed so that the sloped surface connecting the recess and the protrusion is inclined with respect to the direction of stacking the nitride semiconductor layers, so that the efficiency of extracting light from the nitride semiconductor device can be improved.

The substrate may have a base layer or the like formed thereon. For the base layer, particularly in case the substrate is made of a material different from the semiconductor layer to be formed thereon, a low-temperature growth buffer layer formed by growing $Al_xGa_{1-x}N$ ($0 \leq x \leq 1$) at a low temperature (200 to 900° C.) as a nucleus of crystal forming layer and a nucleus of crystal growing layer, and a buffer layer formed thereon comprising single crystal and a high-temperature growth layer, for example, may be used. The thickness of the layer may be approximately in a range from 50 Å to 0.1 μm. A layer known as ELO (epitaxial lateral overgrowth) may also be formed. That is, growth portions such as islands (protrusion, mask opening) may be grown on the substrate or on the base layer preferentially or selectively over other regions, so that the selectively grown portion grows horizontally and joins thereby to form a growth layer. This enables it to obtain a device structure where the crystallinity is improved and, in particular, crystal defects are reduced. While the base layer may be included in the functional section as the light emitting element structure, it is usually used only for the growth of the light emitting element structure and is provided as a non-functional section that does not function as the light emitting element.

The nitride semiconductor layer may be made of GaN, AlN, InN, or group III-V element nitride semiconductor that is a mixed crystal of the former. The group III-V element nitride semiconductor may be $In_\alpha Al_\beta Ga_{1-\alpha-\beta}N$ ($0 \leq \alpha$, $0 \leq \beta$, $\alpha+\beta \leq 1$), composition having the group III element partially or entirely substituted by boron, or composition having nitrogen as the group V element partially substituted by P, As or Sb. The semiconductor layer may also use InAlGaP-based material, InP-based material, AlGaAs-based material or a mixed crystal thereof in a part of the layer.

The nitride semiconductor layer may be formed by MOVPE (metalorganic vapor phase epitaxy), HVPE (halide vapor phase epitaxy), MBE (molecular beam epitaxy), MOCVD (metalorganic chemical vapor phase epitaxy) or other process. Among these, it is preferable to grow by MOCVD or MBE process.

The nitride semiconductor layer of desired conductivity type may be formed by adding a dopant that functions as an acceptor or a donor. As an n-type dopant, group IV or group VI element may be used such as Si, Ge, Sn, S, O, Ti or Zr. Among these, Si, Ge and Sn are preferable and Si is more preferably used. As a p-type dopant, Be, Zn, Mn, Cr, Mg, Ca or the like may be used. Among these, Mg is preferable. The nitride semiconductor layer can function as an n-type semiconductor layer even when it is not doped with a dopant. The n-type semiconductor layer and the p-type semiconductor layer may partially include undoped layer and a semi-insulating layer.

The n-type semiconductor layer has such a layer structure that includes a dopant of either conductivity type so as to achieve the connection with the electrode and supply and diffusion of the carrier into the active layer (light emission layer). In particular, it is preferable that the layer (contact layer) that supplies the carrier (electron) into surface while diffusing in a region ranging from the region for connection with the electrode to right below the light emission layer is doped with a higher concentration than other regions. In addition to the layers (contact layer and the layers formed in the vicinity thereof) that supply and diffuse the carrier, it is preferable to provide an intermediate layer that moves and supplies the carrier to the light emission layer in the layer stacking direction, a cladding layer that confines the carrier of the p-type semiconductor layer within the light emission layer, separately from the contact layer. Such layers may be formed by means of low impurity concentration layer where the dopant concentration is lower than that in the in-surface diffusion layer, an undoped layer or a multi-layer film that includes the former.

This layer makes it possible to mitigate the deterioration of crystallinity due to the in-surface diffusion layer that has a relatively high concentration of impurity, and improve the crystallinity of the layer formed thereon.

The multi-layer film has preferably such a periodic structure as layers of two kinds that have different compositions are at least stacked one on another. Specifically, a periodic structure consisting of a nitride semiconductor layer that includes In and a layer having a different composition, for example, $In_xGa_{1-x}N/In_yGa_{1-y}N$ ($0 \leq x < y < 1$) may be formed. The structure may also be of a composition that has a gradient in the component concentration, composition of modified impurity concentration in a periodical structure or graded structure, or a structure having varying thickness. When the crystallinity is taken into consideration, in particular, the multi-layer film is preferably formed in such a structure as layers having the thickness of 20 nm or less are stacked one on another, more preferably layers having the thickness of 10 nm or less are stacked one on another.

The light emission layer is preferably formed between the n-type semiconductor layer and the p-type semiconductor layer. When a nitride semiconductor that includes In (for example, InGaN) is used as the light emission layer, wavelength of the emitted light can be controlled over a region ranging from ultraviolet to visible light (red, green and blue) by changing the mix proportion of In, thus achieving further higher efficiency of light emission. Emission of ultraviolet ray can also be achieved by using a material having higher band gap than InGaN, such as GaN or AlGaN.

Moreover, it is preferable to use an active layer of quantum well structure for the light emission layer (which may also be referred to as the active layer), for example, single quantum well structure that has a single well layer and more preferably multiple quantum well structure where a plurality of well layers are stacked via barrier layer. The well layer is preferably made of InGaN, and the barrier layer is preferably made of InGaN, GaN, AlGaN or the like so as to have a greater band gap energy than the well layer has. The barrier layer may also be provided as a stack of a plurality of layers having different compositions between two well layers. The thickness of the well layer and the barrier layer is 30 nm or less, and preferably 20 nm or less. When the well layer is formed with the thickness of 10 nm or less, in particular, a light emission layer having high quantum efficiency can be obtained. The well layer and the barrier layer may or may not be doped with a dopant of each conductivity type.

The p-type semiconductor layer is preferably provided with a cladding layer that confines the carrier within the light emission layer and a contact layer that is connected with the electrode. It is particularly preferable to provide the cladding layer on the light emission layer and provide the contact layer thereon, and dope the contact layer with a dopant in a high concentration.

The cladding layer is preferably made of a nitride semiconductor that includes Al, and particularly AlGaN. Efficiency of the light emission layer can be improved by forming the cladding layer in the vicinity of or in contact with the light emission layer.

A device having high withstanding voltage can be obtained by providing a layer having lower impurity concentration than the contact layer and the cladding layer between these layers.

In addition, crystallinity can be improved by doping the contact layer with a high concentration. Since the contact layer emits light at a position below the region where the electrode is connected, it can also function as a layer that diffuses the carrier within the plane. As the layer is caused to function to diffuse current within the plane by means of the electrode, diffusion of the p-type carrier that has lower mobility in the nitride semiconductor can be assisted. Moreover, by making the thickness of the contact layer smaller than the other layers (cladding layer, intermediate low concentration layer) and doping the contact layer with an impurity in higher concentration than in the other layers, it is made possible to form a layer having a high carrier concentration and inject the carrier from the electrode efficiently.

The n electrode provided on the n-type semiconductor layer and the p electrode provided on the p-type semiconductor layer are not restricted on the shape, position, material, thickness and other properties, as long as they can be formed on the n-type semiconductor layer and the p-type semiconductor layer in connection therewith.

For example, in case the n-type semiconductor layer, the active layer and the p-type semiconductor layer are formed one on another in this order, it is preferable that the n electrode is formed on the top surface of the n-type semiconductor layer and the p electrode is formed on the top surface of the p-type semiconductor layer, the top surfaces being exposed by partially removing the p-type semiconductor layer and the active layer, and optionally a part of the p-type semiconductor layer in the direction of the thickness.

The n electrode and the p electrode can be formed in a single layer or a stack of layers from a material that provides ohmic contact with the n-type semiconductor layer and on the p-type semiconductor layer, for example, a metal such as aluminum, nickel, gold, silver, copper, chromium, molybdenum, titanium, indium, gallium or platinum-group material (for example, Pt, Rh, Pd, Ir, Ru, Os, etc.), or an electrically conductive oxide such as ITO, ZnO or $SnO_2$. These electrodes may be formed with the thickness of about 50 nm to 15 µm. It is necessary to select the materials for the n electrode and the p electrode so as to achieve the highest efficiency of extracting light in accordance to the method of mounting the light emitting device (for example, face down, face up, etc.), direction of the light emitting surface and other conditions.

The n electrode and the p electrode can be formed by a method known in the art, for example, by forming a film of the material that makes-the electrode over substantially the entire surface of the semiconductor layer, and forming the film into a pattern by photolithography and etching, lift-off, EB method or other process.

Based on the other structure of the nitride semiconductor device, the stacking structures described as stacking structures A though E may be employed for the nitride semiconductor device applicable to the present invention. The minimum constitution that characterizes the present invention is provided to substitute some of the layers located between the n-side contact layer and the active layer, or inserted between the layers.

The following stacking structures A though E are all formed on a growth substrate, and sapphire is preferable for the growth substrate.

Stacking structure A: A buffer layer made of GaN (200 Å thick), an n-side contact layer made of Si-doped GaN (4 µm), a light emission layer of single quantum well structure made of undoped $In_{0.2}Ga_{0.8}N$ (30 Å), a p-type cladding layer made of Mg-doped p-type $Al_{0.1}Ga_{0.9}N$ (0.2 µm) and a p-side contact layer made of Mg-doped p-type GaN (0.5 µm).

Stacking structure B: A buffer layer made of AlGaN (about 100 Å thick), an undoped GaN layer (1 µm), an n-side contact layer made of GaN including $4.5 \times 10^{18}/cm^3$ of Si (5 µm), a first n-side multi-layer film (total thickness 3350 Å) consisting of three layers of a base layer made of undoped GaN (3000 Å), an intermediate layer made of GaN including $4.5 \times 10^{18}/cm^3$ of Si (300 Å) and an upper layer made of undoped GaN (50 Å), a second n-side multi-layer film (total thickness 640 Å) of super lattice structure consisting of ten undoped GaN layers (40 Å) and ten undoped $In_{0.1}Ga_{0.9}N$ layers (20 Å) stacked alternately with an undoped GaN (40 Å) stacked thereon, a light emission layer of multiple quantum well structure (total thickness 1930 Å) consisting of six barrier layers made of undoped GaN (250 Å) and six well layers made of $In_{0.3}Ga_{0.7}N$ layers (30 Å) stacked alternately with a barrier layer made of undoped GaN (250 Å) stacked thereon, a p-side multi-layer film (total thickness 365 Å) of super lattice structure consisting of five $Al_{0.15}Ga_{0.85}N$ layers (40 Å) including $5 \times 10^{19}/cm^3$ of Mg and five $In_{0.03}Ga_{0.97}N$ layers (25 Å) including $5 \times 10^{19}/cm^3$ of Mg stacked alternately with $Al_{0.15}Ga_{0.85}N$ layer (40 Å) including $5 \times 10^{19}/cm^3$ of Mg stacked thereon, and a p-side contact layer made of GaN (1200 Å) including $1 \times 10^{20}/cm^3$ of Mg.

Stacking structure C: A buffer layer made of AlGaN (about 100 Å thick), an undoped GaN layer (1 µm), an n-side contact layer made of GaN including $4.5 \times 10^{18}/cm^3$ of Si (5 µm), a first n-side multi-layer film (total thickness 3350 Å) consisting of three layers of a base layer made of undoped GaN (3000 Å), an intermediate layer made of GaN including $4.5 \times 10^{18}/cm^3$ of Si (300 Å) and an upper layer made of undoped GaN (50 Å), a second n-side multi-layer film (total thickness 640 Å) of super lattice structure consisting of ten undoped GaN layers (40 Å) and ten undoped $In_{0.1}Ga_{0.9}N$ layers (20 Å) stacked alternately with an undoped GaN (40 Å) stacked thereon, a light emission layer of multiple quantum well structure (total thickness 1930 Å) consisting of six barrier layers made of undoped GaN (250 Å) and six layers of 3-layer structure comprising well layer made of $In_{0.3}Ga_{0.7}N$ (30 Å), first barrier layer made of $In_{0.02}Ga_{0.98}N$ (100 Å) and second barrier layer made of undoped GaN (150 Å) stacked alternately (number of repetitions of the alternate stacking is preferably from 3 to 6), a p-side multi-layer film (total thickness 365 Å) of super lattice structure consisting of five $Al_{0.15}Ga_{0.85}N$ layers (40 Å) including $5 \times 10^{19}/cm^3$ of Mg and five $In_{0.03}Ga_{0.97}N$ layers (25 Å) including $5 \times 10^{19}/cm^3$ of Mg stacked alternately with $Al_{0.15}Ga_{0.85}N$ layer (40 Å) including $5 \times 10^{19}/cm^3$ of Mg stacked thereon, and a p-side contact layer made of GaN (1200 Å) including $1 \times 10^{20}/cm^3$ of Mg.

In addition, a layer made of GaN and AlGaN (2000 Å) may be formed between the p-side multi-layer film and the p-side contact layer. This layer is formed without doping, and shows p-type electricity due to the diffusion of Mg from the adjacent layer. Providing this layer increases the withstanding electrostatic voltage of the light emitting device. While this layer may be omitted in case electrostatic protection function is provided separately to the light emitting device, it is preferable to provide this layer in order to increase the withstanding electrostatic voltage of the light emitting device when electrostatic protection function is not provided outside the light emitting device.

Stacking structure D: A buffer layer, an undoped GaN layer, an n-side contact layer made of GaN including $6.0 \times 10^{18}/cm^3$ of Si, an undoped GaN layer (the above layers constitute a n-type nitride semiconductor layer having total thickness of 6 nm), a light emission layer of multiple quantum well structure (total thickness 1000 Å) consisting of five barrier layers made of GaN including $2.0\times10^{18}/cm^3$ of Si and five well layers made of InGaN stacked alternately and p-type nitride semiconductor layer made of GaN including $5.0\times10^{18}/cm^3$ of Mg (film thickness 1300 Å).

In addition, an InGaN layer (30 to 100 Å, preferably 50 Å) may also be provided on the p-type nitride semiconductor layer. This turns the InGaN layer into a p-side contact layer that makes contact with the electrode.

Stacking structure E: A buffer layer, an undoped GaN layer, an n-side contact layer made of GaN including $1.3\times10^{19}/cm^3$ of Si, an undoped GaN layer (the above layers constitute an n-type nitride semiconductor layer having the total thickness of 6 nm), a light emission layer of multiple quantum well structure (total thickness 800 Å) consisting of seven barrier layers made of GaN including $3.0\times10^{18}/cm^3$ of Si and seven well layers made of InGaN stacked alternately and a p-type nitride semiconductor layer made of GaN including $2.5\times10^{20}/cm^3$ of Mg. An InGaN layer (30 to 100 Å, preferably 50 Å) may be provided on the p-type nitride semiconductor layer as the p-side contact layer.

Stacking structures A to E have been described above. It needs not to say that the nitride semiconductor device of the present invention is not limited to these stacking structures.

Now examples of the present invention will be described. It should be noted, however, that the nitride semiconductor device of the present invention is not limited to these examples.

EXAMPLE 1

Example 1 will be described below with reference to FIG. 1.

(Substrate 1)

The substrate 1 made of sapphire (C plane) is set in a reactor vessel of MOVPE, and the substrate is cleaned by raising the substrate temperature to 1050° C. while flowing hydrogen.

(Buffer Layer 2)

With the temperature lowered to 510° C., hydrogen is used as the carrier gas and ammonia and TMG (trimethyl gallium) are used as the stock material gas to grow the buffer layer 2 made of GaN to the thickness of about 100 Å on the substrate 1.

(Base Layer 3)

After growing the buffer layer 2, supply of only the TMG gas is stopped and the temperature is raised to 1050° C. When the temperature has reached 1050° C, the base layer 3 made of undoped GaN is grown to the thickness of about 1.5 μm using TMG and ammonia gas as the stock material gases.

(n-side Contact Layer 4)

Then the n-side contact layer made of GaN doped with Si in concentration of $5\times10^{18}/cm^3$ is grown to the thickness of about 4 μm at a temperature of 1050° C. using TMG and ammonia gas as the stock material gases and silane gas as impurity gas.

(First n-side Layer 5)

At a temperature of 1050° C, supply of only the silane gas is stopped and the first n-side layer 5 made of undoped GaN layer is grown to the thickness of about 1500 Å.

(Second n-side Layer 6)

At a temperature of 1050° C., by using silane gas, the second n-side layer 6 made of GaN doped with $5\times10^{17}/cm^3$ of Si is grown to the thickness of about 100 Å.

(Third n-side Layer 7)

At a temperature of 1050° C., supply of only the silane gas is stopped and the third n-side layer 7 made of undoped GaN is grown to the thickness of about 1500 Å.

(Fourth n-side Layer 8)

At a temperature of 1050° C., by using silane gas, the fourth n-side layer 8 made of GaN doped with $1\times10^{19}/cm^3$ of Si is grown to the thickness of about 300 Å.

(Active Layer 11)

After growing the barrier layer made of undoped GaN grown to the thickness of about 200 Å, the temperature is set to 800° C, and TMG, TMI and ammonia are used to grow the well layer made of undoped $In_{0.3}Ga_{0.7}N$ to the thickness of about 20 Å. Then five barrier layers and four well layers are stacked alternately in the order of barrier layer+well layer+barrier layer+well layer . . . +barrier layer, thereby to grow the active layer 11 of multiple quantum well structure to the total thickness of 1080 Å.

(p-side Contact Layer 14)

Then the p-side contact layer 14 made of p-type GaN doped with $1\times10^{20}/cm^3$ of Mg is grown to the thickness of 1000 Å at a temperature of 1050° C. using TMG, ammonia gas and Cp$_2$Mg.

Upon completion of the reaction, temperature is lowered to the room temperature and the wafer is annealed at 700° C. in nitrogen atmosphere in the reaction vessel, so as to further decrease the resistivity of the p-type layers. After annealing, the wafer is taken out of the reaction vessel and a mask of a predetermined configuration is formed on the uppermost p-side contact layer 14, and the n-side contact layer 4 is exposed as shown in FIG. 1 by etching on the p-side contact layer side in an RIE (reactive ion etching) apparatus.

After etching, a translucent whole-surface portion 15 made of Ni, Au is formed over substantially the entire surface of the uppermost p-side contact layer, and a pad portion 16 that includes W, Pt, Au for bonding is formed thereon to make the p electrode. On the other hand, the n electrode 17 made of the same material as the pad portion that includes W, Pt, Au is formed on the surface of the n-side contact layer 4 that has been exposed by etching in the same process as that of forming the pad portion of the p electrode.

The LEDs that are obtained by cutting the wafer into chips at the end have lower mean value of Vf within the wafer, with the variability in Vf almost eliminated, while maintaining the characteristics such as light emission output power and withstanding electrostatic voltage, in contrast to an LED that is not provided with the second n-side layer 6. When the LED is driven, variability of Vf with the lapse of driving time can be suppressed. The number of LED chips that have lower value of Vf in the early stage of driving can also be decreased.

EXAMPLE 2

Figure 2:
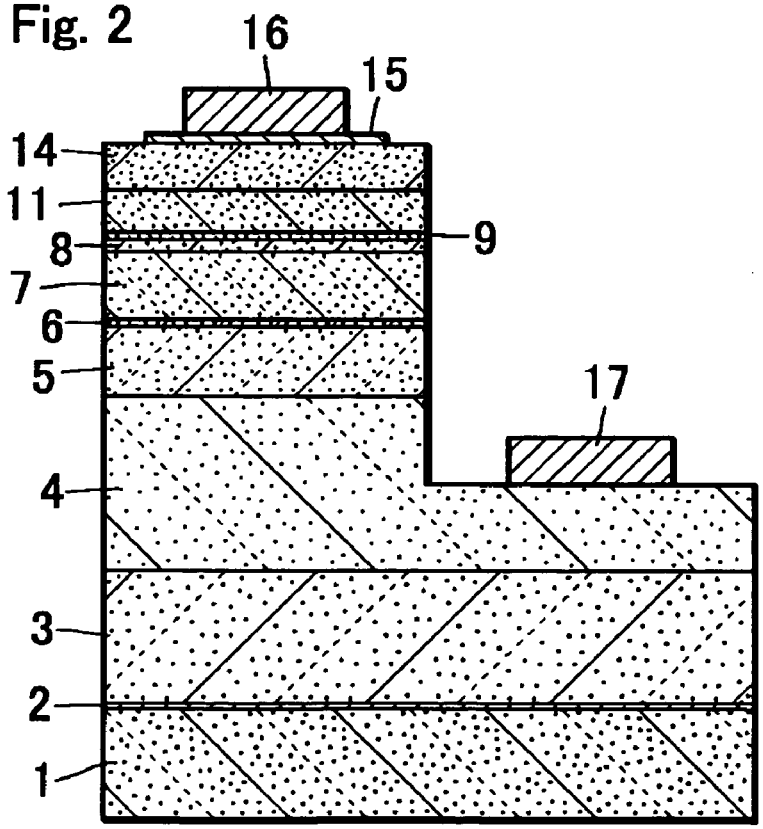
FIG. 2 is a schematic sectional view showing the structure of a nitride semiconductor device according to another example of the present invention.

Example 2 will be described below with reference to FIG. 2. Example 2 is the same as Example 1 except for providing the next fifth n-side layer 9 between the fourth n-side layer 8 and the active layer 11. Withstanding electrostatic voltage of the LED of Example 2 can be greatly improved over that of Example 1, while maintaining other characteristics.

(Fifth n-side Layer 9)

At a temperature of 1050° C., TMG and ammonia are used to grow the fifth n-side layer 9 from undoped GaN to the thickness of about 50 Å.

The fifth n-side layer 9 is preferably made of AlGaN where proportion of Al is 0.2 or less, InGaN where proportion of In is 0.1 or less, and more preferably GaN. The first n-side layer 5 to the fifth n-side layer 9 may have compositions different from each other, but preferably have the same composition and more preferably made of GaN.

The fifth n-side layer 9 has concentration of n-type impurity may be $1 \times 10^{18}/cm^3$ or less, preferably $5 \times 10^{17}/cm^3$ or less and more preferably $1 \times 10^{17}/cm^3$ or less. These ranges of concentration of n-type impurity include undoped composition. Thus the effect described above becomes more conspicuous as the concentration of the n-type impurity becomes lower (the concentration of the n-type impurity approaches zero).

The concentration of the n-type impurity in the second n-side layer 6 and in the fourth n-side layer 8 may be higher than the concentration of the n-type impurity in the fifth n-side layer. This makes the effect described above more conspicuous.

Thickness of the fifth n-side layer 9 is in a range from 10 to 1000 Å, preferably from 15 to 500 Å, more preferably from 25 to 150 Å, and further more preferably from 30 to 80 Å. When thickness of the fifth n-side layer 9 is less than 10 Å, the withstanding electrostatic voltage becomes low. When thickness of the fifth n-side layer 9 is more than 1000 Å, not only the value of Vf becomes higher but also the withstanding electrostatic voltage becomes low.

EXAMPLE 3

Figure 3:
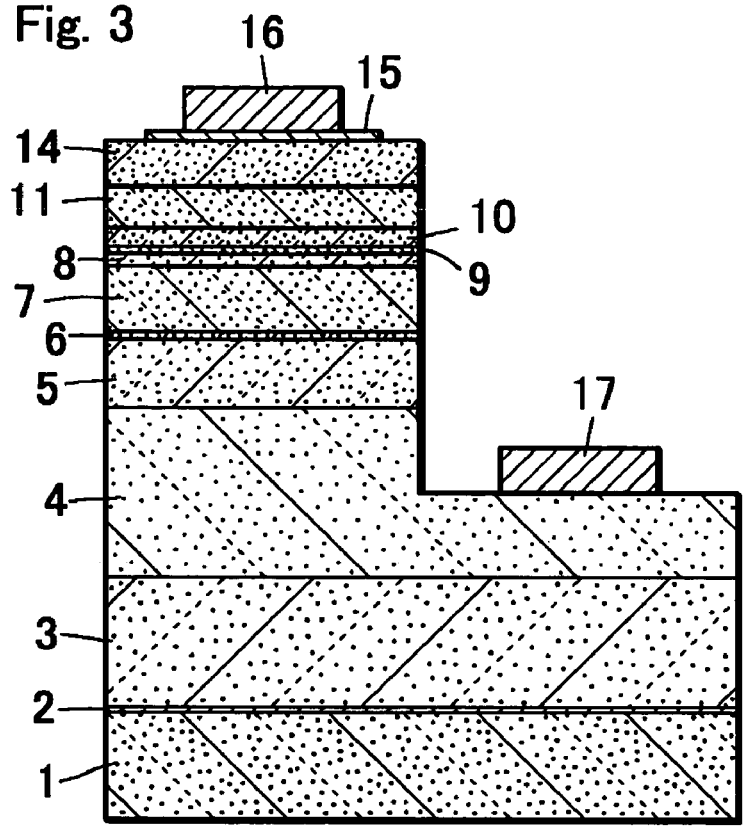
FIG. 3 is a schematic sectional view showing the structure of a nitride semiconductor device according to another example of the present invention.

Example 3 will be described below with reference to FIG. 3. Example 3 is the same as Example 2 except for providing the n-side multi-layer film of super lattice structure between the fifth n-side layer 9 and the active layer 11. Light emission output power can be increased further by providing the n-side multi-layer film of super lattice structure 10.

(n-side Multi-layer Film of Super Lattice Structure 10)

TMG and ammonia are used to grow an undoped GaN layer to thickness of about 35 Å. Then with the temperature lowered, TMG, TMI and ammonia are used to grow a first nitride semiconductor layer made of undoped $In_{0.03}Ga_{0.97}N$ to thickness of about 15 Å. These processes are repeated so as to form both layers, ten times each, one on another alternately. Last, an undoped GaN layer is grown to thickness of about 35 Å thereby to make the n-type multi-layer film of super lattice structure.

According to the present invention, the n-type multi-layer film 6 may be constituted from nitride semiconductors of at least two kinds having different compositions. Preferable compositions are AlGaN where proportion of Al is 0.1 or less (including GaN), and InGaN where proportion of In is 0.1 or less.

While there is no restriction on the thickness of component layers that constitute the n-side multi-layer film of super lattice structure 10, it is preferably 100 Å or less, more preferably 70 Å or less and further more preferably 50 Å or less. This tends to increase the output power. While the component layers that constitute the n-side multi-layer film of super lattice structure 10 may be either undoped or doped with the n-type impurity, it is preferable that all the component layers are undoped.

While the n-side multi-layer film of super lattice structure 10 is provided between the fifth n-side layer 9 and the active layer 11 in this example, a single layer having thickness of 100 Å or more may be provided instead of the n-side multi-layer film of super lattice structure 10.

EXAMPLE 4

Figure 4:
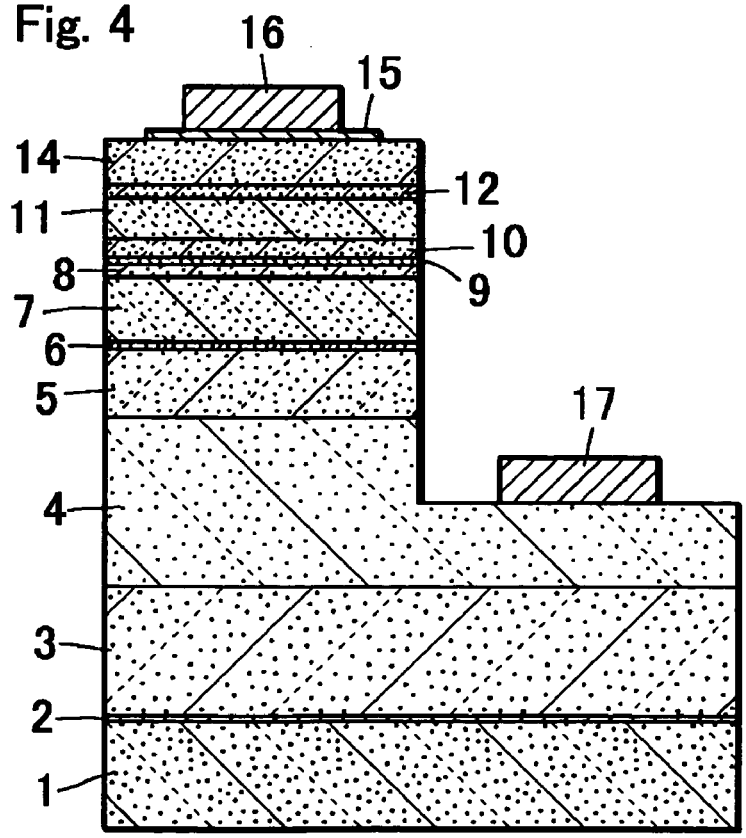
FIG. 4 is a schematic sectional view showing the structure of a nitride semiconductor device according to another example of the present invention.

Example 4 will be described below with reference to FIG. 4. Example 4 is the same as Example 3 except for providing the n-side multi-layer film of super lattice structure between the active layer 11 and the p-side contact layer 14. Light emission output power can be increased further by providing the n-side multi-layer film of super lattice structure 12.

(p-type Multi-layer Film of Super Lattice Structure 12)

A layer is formed from $Al_{0.15}Ga_{0.85}N$ doped with $5 \times 10^{19}/cm^3$ of Mg to the thickness of about 35 Å, using TMG, TMA, ammonia and $Cp_2Mg$ (cyclopentadienyl magnesium). Then with the supply of TMA stopped and TMI supplied instead, a layer made of $In_{0.03}Ga_{0.97}N$ doped with $5 \times 10^{19}/cm^3$ of Mg is formed to the thickness of about 20 Å. These processes are repeated so as to form both layers, five times each, one on another alternately. Last, a layer made of $Al_{0.15}Ga_{0.85}N$ doped with $5 \times 10^{19}/cm^3$ of Mg is formed to the thickness of about 35 Å, thereby to make the p-type multi-layer film of super lattice structure 12.

According to the present invention, the p-type multi-layer film 8 may be constituted from nitride semiconductors of at least two kinds having different compositions. Preferable compositions are AlGaN where proportion of Al is 0.2 or less, and InGaN where proportion of In is 0.1 or less (including GaN).

While there is no restriction on the thickness of component layers that constitute the n-side multi-layer film of super lattice structure 12, it is preferably 100 Å or less, more preferably 70 Å or less and further more preferably 50 Å or less. This tends to increase the output power.

EXAMPLE 5

Figure 5:
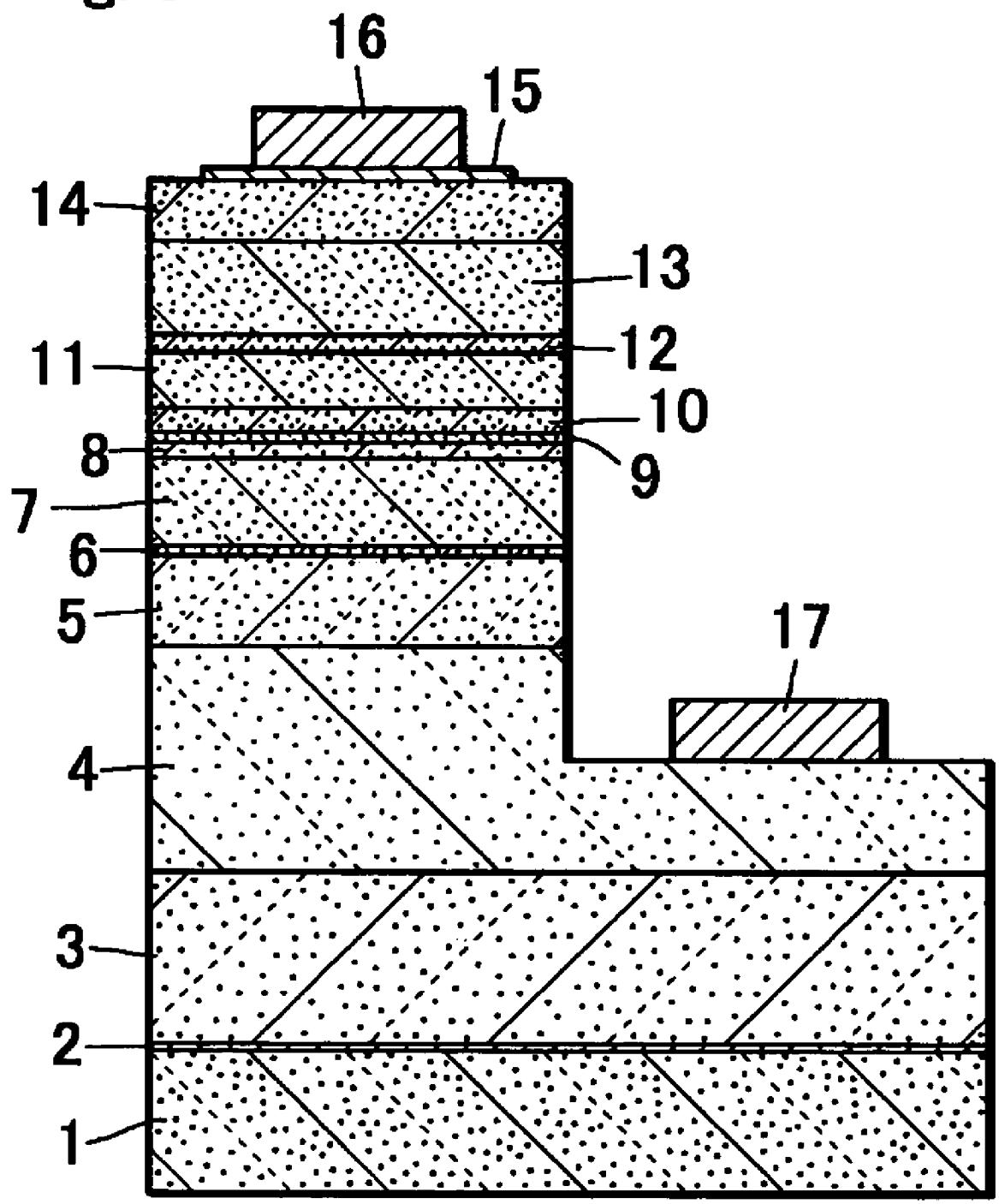
FIG. 5 is a schematic sectional view showing the structure of a nitride semiconductor device according to another example of the present invention.

Example 5 will be described below with reference to FIG. 5. Example 5 is the same as Example 4 except for providing a p-side low-doped layer 13 between the p-side multi-layer film of super lattice structure 12 and the p-side contact layer 14. Providing the p-side low-doped layer 13 enables it to further improve the light emission output power and improve the withstanding electrostatic voltage.

(p-side Low-doped Layer 13)

With the temperature set to 1050° C., TMG, TMA and ammonia are used to, grow the p-side low-doped layer 13 made of undoped $Al_{0.05}Ga_{0.95}N$ to the thickness of about 2000 Å.

The p-side low-doped layer 13 is made of GaN, AlGaN including Al in proportion of 0.2 or less or InGaN including In in proportion of 0.1 or less, and more preferably AlGaN including Al in proportion of 0.15 or less. The p-type impurity concentration in the p-side low-doped layer 13 is $1 \times 10^{18}/cm^3$ or less, preferably $5 \times 10^{17}/cm^3$ or less and more preferably $1 \times 10^{17}/cm^3$ or less, and furthermore preferably undoped, which makes the effects more conspicuous.

Thickness of the p-side low-doped layer 13 is 100 Å or more, preferably in a range from 100 to 10000 Å, more preferably from 300 to 5000 Å, and further more preferably from 300 to 3000 Å. When thickness of the p-side low-doped layer 13 is less than 100 Å, the withstanding electrostatic voltage becomes insufficient. When thickness of the p-side low-doped layer 13 is more than 10000 Å, not only the value of Vf becomes higher, but also the withstanding electrostatic voltage becomes insufficient.

COMPARATIVE EXAMPLE 1

Comparative Example 1 is the same as Example 5, except for replacing the three layers of the first n-side layer 5, the second n-side layer 6 and the third n-side layer 7 with one layer made of GaN having the same Si concentration ($5 \times 10^{17}/cm^3$) as that of the second n-side layer 6. Thickness of the layer is approximately equal to the total thickness of the first n-side layer 5, the second n-side layer 6 and the third n-side layer 7.

The LED in this comparative example had a lower withstanding electrostatic voltage than the LED of Example 5 had. Similar tendency was observed when only the first n-side layer 5 of Example 5 was formed in GaN having the same Si concentration ($5 \times 10^{17}/cm^3$) as that of the second n-side layer 6 of Example 1, and when only the third n-side layer 7 of Example 5 was formed in GaN having the same Si concentration ($5 \times 10^{17}/cm^3$) as that of the second n-side layer 6 of Example 1

COMPARATIVE EXAMPLE 2

Comparative Example 2 is the same as Example 5, except for forming the second n-side layer 6 as the same undoped GaN as first n-side layer 5 of Example 1, and replacing the first n-side layer 5, the second n-side layer 6 and the third n-side layer 7 with one layer made of undoped GaN. The thickness of the layer is approximately equal to the total thickness of the first n-side layer 5, the second n-side layer 6 and the third n-side layer 7 in Example 1.

The LED in this comparative example had a high withstanding electrostatic voltage comparable to that of the LED of Example 5, although the value of Vf was high and variability of Vf with the lapse of driving time was observed when the LED was driven.

EXAMPLE 6

Example 6 is a variation of the nitride semiconductor device of Example 1 where the third n-side layer and the fourth n-side layer are omitted and the first n-side layer and the second n-side layer are provided as follows as one of the minimum constitution.

(First n-side Layer 5)

At a temperature of 1050° C., supply of only the silane gas is stopped and the first n-side layer 5 made of undoped GaN layer is grown to the thickness of about 1500 Å.

(Second n-side Layer 6)

At a temperature of 1050° C., by using silane gas, the second n-side layer 6 made of GaN doped with $1 \times 10^{18}/cm^3$ of Si is grown to the thickness of about 100 Å.

The device made as described above had higher withstanding electrostatic voltage than the device made by growing the second n-side layer undoped (namely the second n-side layer is omitted and the first n-side layer is grown to the thickness of about 1600 Å), and variability of Vf with the lapse of driving time can be suppressed when the LED is driven.

EXAMPLE 7

In Example 5, when an InGaN layer was formed to the thickness of 100 Å between the second n-side layer and the third n-side layer, although the withstanding electrostatic voltage was a little lower, the device had better electrostatic voltage withstanding characteristic than Comparative Example 1. Variability of Vf with the lapse of driving time can be suppressed compared to Comparative Example 2.

EXAMPLE 8

A device is made similarly to Example 5, except for growing the third n-side layer and the fourth n-side layer as follows.

The third n-side layer 7 is formed by growing undoped $In_{0.01}Ga_{0.99}N$ layer to the thickness of 1500 Å.

The fourth n-side layer 8 is formed by growing $In_{0.01}Ga_{0.99}N$ layer doped with $1 \times 10^{19}/cm^3$ of Si to the thickness of 300 Å.

The device made as described above has withstanding electrostatic voltage that is a little lower than that of Example 5 but is higher than that of Comparative Example 1. Variability of Vf with the lapse of driving time can be suppressed similarly to Comparative Example 2 when driving the LED.

EXAMPLE 9

In Example 9, a device is made similarly to Example 6, except for changing the first n-side layer and the second n-side layer from GaN to $Al_{0.15}Ga_{0.85}N$. The device made as described above has higher value of Vf, lower crystallinity and lower efficiency of light emission compared to Example 6. However, the withstanding electrostatic voltage is only a little lower than that of Example 6 and variability of Vf with the lapse of driving time can be suppressed when driving the LED similarly to the case of Example 6.

EXAMPLE 10

In Example 10, a device is made similarly to Example 5, except for forming the second n-side layer as follows.

(Second n-side Layer 6)

A GaN layer doped with $1 \times 10^{19}/cm^3$ of Si is grown to the thickness of about 100 Å.

The device made as described above has an efficiency of light emission and a withstanding electrostatic voltage that are lower than those in Example 5, but the withstanding electrostatic voltage is higher than that of Comparative Example 1 and variability of Vf with the lapse of driving time can be suppressed compared to Comparative Example 2.

EXAMPLE 11

In Example 11, a device is made similarly to Example 5, except for forming the second n-side layer and the fourth n-side layer as follows.

(Second n-side Layer 6)

A GaN layer doped with $1 \times 10^{19}/cm^3$ of Si is grown to the thickness of about 100 Å.

(Fourth n-side Layer 8)

A GaN layer doped with $5 \times 10^{19}/cm^3$ of Si is grown to the thickness of about 300 Å.

The device made as described above has an efficiency of light emission and a withstanding electrostatic voltage that are lower than those in Example 5 and experiences some variability of Vf with the lapse of driving time, but the withstanding electrostatic voltage is higher than Comparative Example 1 and variability of Vf with the lapse of driving time can be suppressed compared to Comparative Example 2.

EXAMPLE 12

Figure 12:
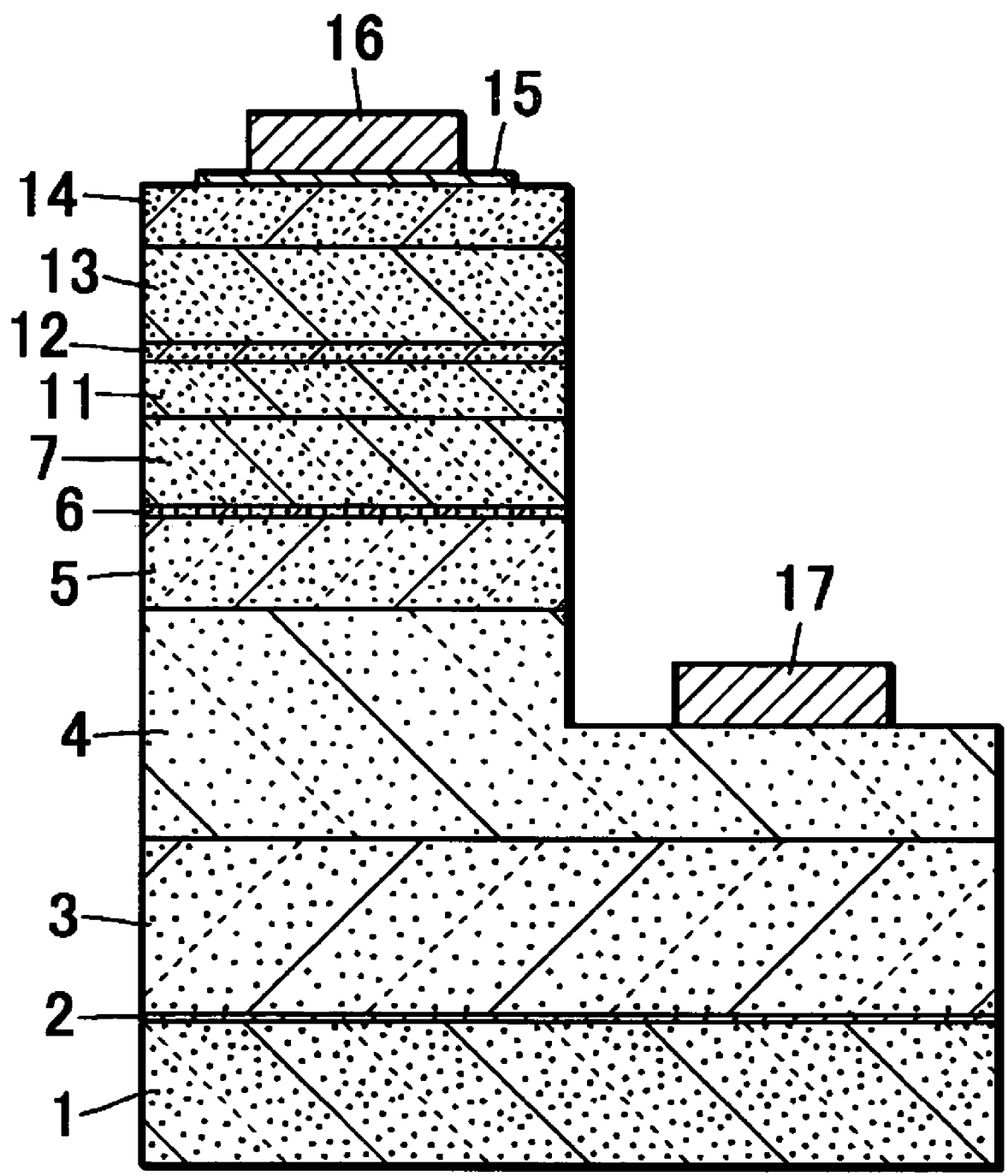
FIG. 12 is a schematic diagram showing the structure of a nitride semiconductor device according to Embodiment 2 of the present invention.

Example 12 will be described below with reference to FIG. 12.

The layers from the substrate 1 to the n-side contact layer 4 are grown similarly to Example 5.

(First n-side Layer 5)

At a temperature of 1050° C., supply of only the silane gas is stopped and the first n-side layer 5 made of undoped GaN layer is grown to the thickness of about 1500 Å.

(Second n-side Layer 6)

At a temperature of 1050° C., by using silane gas, the second n-side layer 6 made of GaN doped with $5\times10^{18}/cm^3$ of Si is grown to the thickness of about 500 Å.

(Third n-side Layer 7)

At a temperature of 1050° C., supply of only the silane gas is stopped and the third n-side layer 7 made of undoped GaN is grown to the thickness of about 1500 Å.

(Active Layer 11)

After growing the barrier layer made of undoped GaN to the thickness of 200 Å, the temperature is set to 800° C., and TMG, TMI and ammonia are used to grow the well layer made of undoped $In_{0.3}Ga_{0.7}N$ to the thickness of 20 Å. Then five barrier layers and four well layers are stacked alternately in the order of barrier layer+well layer+barrier layer+well layer . . . +barrier layer, thereby to grow the active layer 11 of multiple quantum well structure to the total thickness of 1080 Å.

(p-side Contact Layer 14)

At a temperature of 1050° C. using TMG, ammonia gas and Cp$_2$Mg, the p-side contact layer 14 made of p-type GaN doped with $1\times10^{20}/cm^3$ of Mg is grown to the thickness of 1000 Å.

Upon completion of the reaction, temperature is lowered to the room temperature and the wafer is annealed at 700° C. in nitrogen atmosphere in the reaction vessel, so as to further decrease the resistivity of the p-side layers. After annealing, the wafer is taken out of the reaction vessel and a mask of a predetermined configuration is formed on the uppermost p-side contact layer 14, and the n-side contact layer 4 is exposed as shown in FIG. 1 by etching on the p-side contact layer side in an RIE (reactive ion etching) apparatus.

After etching, a translucent whole-surface portion 15 made of ITO (indium-tin-oxide) is formed over substantially the entire surface of the uppermost p-side contact layer, and a pad portion 16 that includes W, Pt, Au for bonding is formed thereon to make the p electrode. On the other hand, the n electrode 17 made of the same material as the pad portion that includes W, Pt, Au is formed on the surface of the n-side contact layer 4 that has been exposed by etching in the same process as that of forming the pad portion of the p electrode.

The LEDs that are obtained by cutting the wafer into chips at the end have lower mean value of Vf within the wafer and variability in Vf being suppressed, while maintaining the characteristics such as light emission output power and withstanding electrostatic voltage, in comparison to an LED where the undoped GaN layer is substantially grown to the thickness of 3000 Å from the first n-side layer 5 and the third n-side layer without providing the second n-side layer 6.

EXAMPLE 13

In Example 13, a device is made similarly to Example 12, except for forming the fourth n-side layer 8 as follows after forming the third n-side layer 7.

(Fourth n-side Layer 8)

A GaN layer doped with $1\times10^{19}/cm^3$ of Si is grown to the thickness of about 300 Å.

The device made as described above has effects similar to those of Example 12, and also has the value of Vf decreased further.

EXAMPLE 14

In Example 14, a device is made similarly to Example 12, except for forming the second n-side layer 6 as follows.

(Second n-side Layer 6)

A $In_{0.02}Ga_{0.98}N$ layer doped with $5\times10^{18}/cm^3$ of Si is grown to the thickness of about 500 Å.

The device made as described above has effects similar to those of Example 12, but shows a little lower value of withstanding electrostatic voltage.

EXAMPLE 15

Figure 13:
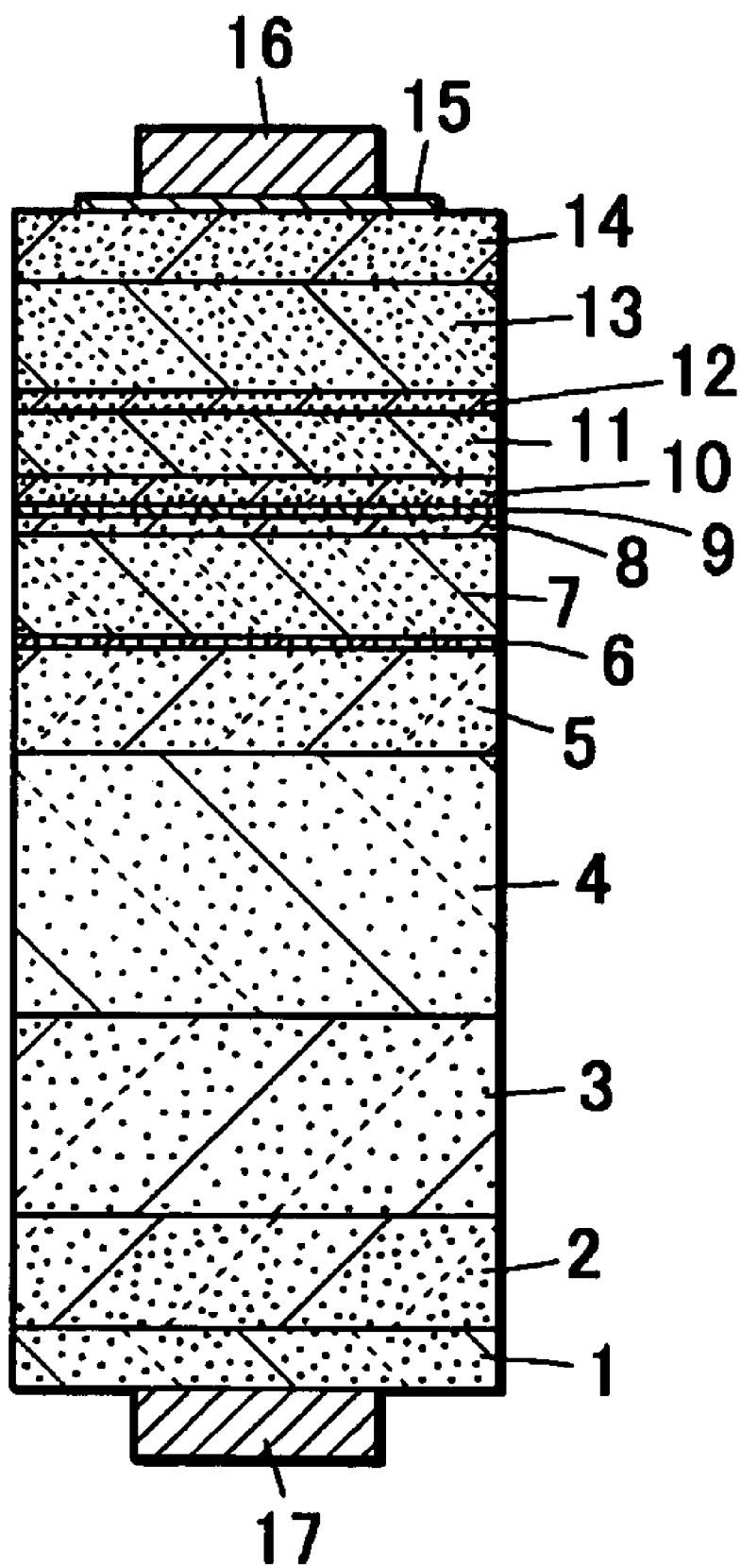
FIG. 13 is a schematic diagram showing the structure of a nitride semiconductor device according to another example of the present invention.

While cross sections of the nitride semiconductor device of the other examples are schematically shown in FIG. 10, Example 15 has the n electrode 17 provided on the surface opposite to the p electrode side of the electrically conductive substrate 1, as shown in the schematic sectional view of FIG. 13, and Si substrate is used in this example. The device is provided with a plurality of nitride semiconductor devices, the p electrode and the n electrode material similar to Example 5.

This device also has effects similar to those of Example 5.

EXAMPLE 16

Figure 14:
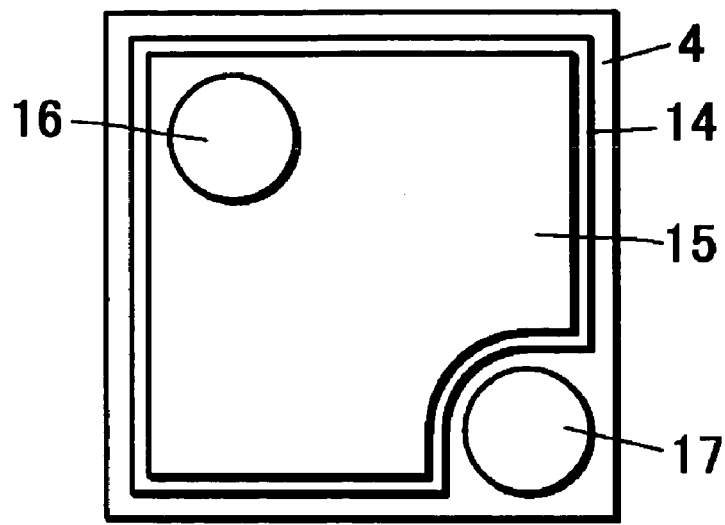
FIG. 14 is a schematic diagram showing the structure of a nitride semiconductor device according to another example of the present invention (schematic diagram of the nitride semiconductor device viewed from the side of a p electrode in the example).

In Example 16, a device is made by changing the area of the interface between the first n-side layer and the second n-side layer in Example 5. The nitride semiconductor device of this example is made so that the appearance of the device viewed from the p electrode side is as shown in FIG. 14. FIG. 14 is a schematic diagram of the nitride semiconductor device viewed from the p electrode side in one example. The n-type nitride semiconductor layer, the active layer and the p-type nitride semiconductor layer are formed in this order on the substrate, while the translucent whole-surface portion 15 and the p electrode comprising the pad portion 16 are formed on the surface of the p-side contact layer 14 of the p-type nitride semiconductor layer, while three pad portions 16 are provided on one end face of the nitride semiconductor device and a current diffusion section is provided from the one end face toward the opposing end face. The device has an exposed surface of the n-side contact layer 4, so that the n electrode 17 is formed on the exposed surface, while the n electrode has three pad portions provided on the other end opposite to the end face where the pad portion of the p electrode is provided, and a current diffusion section that is parallel to the current diffusion section of the p electrode and extends toward the end face where the pad portion of the p electrode is provided. Such a constitution of the nitride semiconductor device can make the distance of the p electrode (the p electrode comprising the whole-surface portion, the pad portion and the current diffusion portion) and the n electrode (the n electrode comprising the pad portion and the current diffusion portion) uniform within the light emission plane.

Four kinds of Samples 1 to 4 having configuration shown in FIG. 14 are made with the following differences.

(Sample 1) The device of Example 5 where the interface area from the first n-side layer to the active layer and further to the p-side contact layer is 0.36 mm$^2$.

(Sample 2) The device of Comparative Example 1 where the interface area from the first n-side layer to the active layer and further to the p-side contact layer is 0.36 mm$^2$.

(Sample 3) The device of Example 5 where the interface area from the first n-side layer to the active layer and further to the p-side contact layer is 2.25 mm$^2$.

(Sample 4) The device of Comparative Example 1 where the interface area from the first n-side layer to the active layer and further to the p-side contact layer is 2.25 mm$^2$.

Samples 1 and 3 are devices having the undoped layer and a layer including n-type impurity (provided with minimum constitution), each having withstanding electrostatic voltage higher than those in Samples 2 and 4, where variability of Vf with the lapse of driving time is suppressed. Samples 1 to 4 are made by stacking nitride semiconductor layers on a sapphire substrate two inches in diameter, dividing the substrate on which the nitride semiconductor layers into chips, thereby to obtain a plurality of nitride semiconductor devices from a single substrate. When the plurality of devices are driven, comparison of the number of chips (devices) where the variability of Vf with the lapse of driving time is suppressed shows that improvement in yield of Sample 1 over Sample 2 (proportion of devices that do not experience variation in Vf after driving for a predetermined period of time is 85% for Sample 2, and is 98% for Sample 1) is better than improvement in yield of Sample 3 over Sample 4 (proportion of devices that do not experience variation in Vf after driving for a predetermined period of time is 83% for Sample 4, and is 90% for Sample 3). This is supposedly because number of electrons flowing from the n-side contact layer into the active layer per unit area is larger in Sample 1 than Sample 3.

EXAMPLE 17

Figure 15:
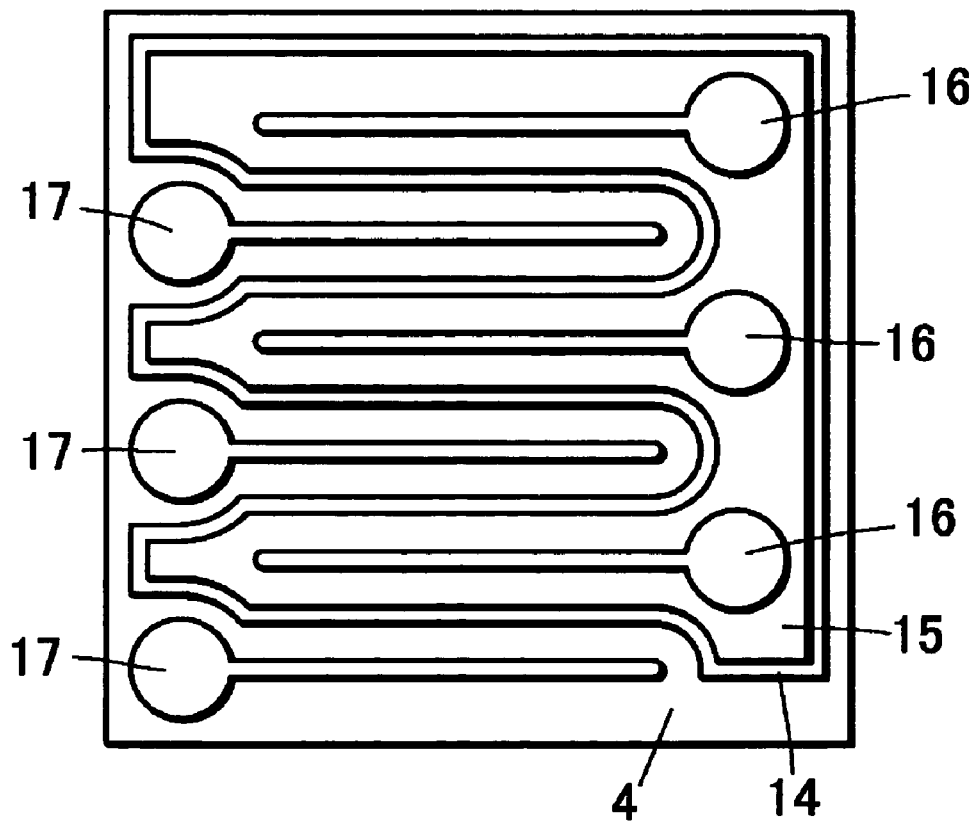
FIG. 15 is a schematic diagram showing the structure of a nitride semiconductor device according to another example of the present invention (schematic diagram of the nitride semiconductor device viewed from the side of the p electrode in the example).

In Example 17, a device is made by changing the height between the plane that joins with the nitride semiconductor layer of the active layer side of the n-side contact layer and the plane where the n electrode is formed in Example 5. In this example, such a device is used as the interface area from the first n-side layer to the active layer and further to the p-side contact layer is 0.1 mm$^2$ within 1 mm$^2$. The device is made so that the appearance of the device viewed from the p electrode side is as shown in FIG. 15. FIG. 15 is schematic diagram of the nitride semiconductor device viewed from the p electrode side in one example. The n-type nitride semiconductor layer, the active layer and the p-type nitride semiconductor layer are formed in this order on the substrate, while the translucent whole-surface portion 15 and the p electrode comprising the pad portion 16 are formed on the surface of the p-side contact layer 14 of the p-type nitride semiconductor layer. The n electrode 17 is formed on the surface where the n-side contact layer 4 is exposed, at a position opposite to the pad portion 16 of the p electrode.

Four kinds of Samples 5 to 8 having configuration shown in FIG. 15 are made with the following differences.

(Sample 5) The device of Example 5 where the distance between first principal plane F1 and third principal plane F3 (the plane where the n electrode 17 is formed) of the n-side contact layer 4 is 3.5 µm.

(Sample 6) The device of Comparative Example 1 where the distance between the first principal plane F1 and the third principal plane F3 (the plane where the n electrode 17 is formed) of the n-side contact layer 4 is 3.5 µm.

(Sample 7) The device of Example 5 where the distance between the first principal plane F1 and the third principal plane F3 (the plane where the n electrode 17 is formed) of the n-side contact layer 4 is 2.0 µm.

(Sample 8) The device of Comparative Example 1 where the distance between the first principal plane F1 and the third principal plane F3 (the plane where the n electrode 17 is formed) of the n-side contact layer 4 is 2.0 µm.

Samples 5 and 8 are made by stacking nitride semiconductor layers on a sapphire substrate two inches in diameter, dividing the substrate on which the nitride semiconductor layers are formed into chips, thereby to obtain a plurality of nitride semiconductor devices from a single substrate. When the plurality of devices are driven, comparison of the number of chips (devices) where the variability of Vf with the lapse of driving time is suppressed shows that improvement in yield of Sample 5 over Sample 6 (proportion of devices that do not experience variation in Vf after driving for a predetermined period of time is 80% for Sample 6, and is 95% for Sample 5) is better than the improvement in yield of Sample 7 over Sample 8 (proportion of devices that do not experience variation in Vf after driving for a predetermined period of time is 83% for Sample 8, and is 92% for Sample 7). This is supposedly because the region where the number of electrons flowing from the n-side contact layer into the active layer per unit area extends to the contact layer surface away from the n electrode and collisions with the spike are taking place evenly over the entire interface with the n-side contact layer 4.

EXAMPLE 18

Devices similar to that of Example 17 are made in four kinds of Samples 9 to 12 instead of Samples 5 to 8 with the following differences.

(Sample 9) The device of Example 5 where the distance between the first principal plane F1 and third-principal plane F3 (the plane where the n electrode 17 is formed) of the n-side contact layer 4 is 70% of the distance between the first principal plane F1 and second principal plane F2 (the plane where the n-side contact layer 4 makes contact with the nitride semiconductor layer on the active layer side).

(Sample 10) The device of Comparative Example 1 where the distance between the first principal plane F1 and the third principal plane F3 (the plane where the n electrode 17 is formed) of the n-side contact layer 4 is 70% of the distance between the first principal plane F1 and second principal plane F2 (the plane where the n-side contact layer 4 makes contact with the nitride semiconductor layer on the active layer side).

(Sample 11) The device of Example 5 where the distance between the first principal plane F1 and the third principal plane F3 (the plane where the n electrode 17 is formed) of the n-side contact layer 4 is 90% of the distance between the first principal plane F1 and second principal plane F2 (the plane where the n-side contact layer 4 makes contact with the nitride semiconductor layer on the active layer side).

(Sample 12) Device of Comparative Example 1 where the distance between the first principal plane F1 and third principal plane F3 (the plane where the n electrode 17 is formed) of the n-side contact layer 4 is 90% of the distance between the first principal plane F1 and the second principal plane F2 (the plane where the n-side contact layer 4 makes contact with the nitride semiconductor layer on the active layer side).

Samples 9 to 12 are made by stacking nitride semiconductor layers on a sapphire substrate two inches in diameter, dividing the substrate on which the nitride semiconductor layers are formed into chips, thereby to obtain a plurality of nitride semiconductor devices from a single substrate. When the plurality of devices are driven, comparison of the number of chips (devices) where the variability of Vf with the lapse of driving time is suppressed shows that improvement in yield of Sample 9 over Sample 10 (proportion of devices that do not experience variation in Vf after driving for a predetermined period of time is 80% for Sample 10, and is 92% for Sample 9) is better than the improvement in yield of Sample 11 over Sample 12 (proportion of devices that do not experience variation in Vf after driving for a predetermined period of time is 82% for Sample 12, and is 88% for Sample 11). This is supposedly because the region where the number of electrons flowing from the n-side contact layer into the active layer per unit area extends to the contact layer surface away from the n electrode and collisions with the spike are taking place evenly over the entire interface with the n-side contact layer, in Sample 9 over Sample 11.

The nitride semiconductor device of the present invention can be preferably used in light emitting apparatuses that constitute various light sources such as back light source, display, illumination, vehicle lamps, in the field of light emitting-device, and can also be used as light receiving device or nitride semiconductor laser device.

What is claimed is:

1. A nitride semiconductor device, comprising:
   an active layer provided between an n-side contact layer that has an n electrode and a p-side contact layer that has a p electrode,
   wherein said nitride semiconductor device has at least a first n-side layer, a second n-side layer, a third n-side layer and a fourth n-side layer formed in this order from said n-side contact layer between said n-side contact layer and said active layer;
   at least said second n-side layer and said fourth n-side layer each include an n-type impurity; and
   the concentration of n-type impurity in said second n-side layer and in said fourth n-side layer is higher than the concentration of n-type impurity in said first n-side layer and said third n-side layer.

2. The nitride semiconductor device according to claim 1, wherein the concentration of n-type impurity in said fourth n-side layer is higher than the concentration of n-type impurity in said second n-side layer.

3. The nitride semiconductor device according to claim 1, wherein a fifth n-side layer is further provided between said fourth n-side layer and said active layer; and
   the concentration of n-type impurity in said second n-side layer and in said fourth n-side layer is higher than the concentration of n-type impurity in said fifth n-side layer.

4. The nitride semiconductor device according to claim 3, wherein the concentration of n-type impurity is $1\times10^{18}/cm^3$ or less in said first n-side layer, said third n-side layer and said fifth n-side layer.

5. The nitride semiconductor device according to claim 1, wherein a thickness of said second n-side layer is smaller than a thickness of said first n-side layer, and a thickness of said fourth n-side layer is smaller than a thickness of said third n-side layer.

6. The nitride semiconductor device according to claim 1, wherein said first n-side layer and said third n-side layer have substantially the same compositions or the same band gap energy.

7. The nitride semiconductor device according to claim 1, wherein said second n-side layer and said first n-side layer have substantially the same compositions or the same band gap energy.

8. The nitride semiconductor device according to claim 1, wherein said first n-side layer and the third n-side layer have a thickness of 100 nm or larger.

9. The nitride semiconductor device according to claim 1, wherein said first to third n-side layers are made of GaN.

10. A nitride semiconductor device, comprising:
    at least a first n-side layer, a second n-side layer and a third n-side layer formed in this order from the side of an n-side contact layer between said n-side contact layer that has an n electrode and an active layer,
    wherein said first n-side layer and said second n-side layer are in contact with each other;
    said second n-side layer includes an n-type impurity;
    the concentration of n-type impurity in said second n-side layer is higher than the concentration of n-type impurity in said first n-side layer and in said third n-side layer;
    said second n-side layer and said first n-side layer have substantially the same compositions or the same band gap energy; and
    a thickness of said second n-side layer is smaller than a thickness of said first n-side layer and a thickness of said third n-side layer.

11. The nitride semiconductor device according to claim 10, wherein said first n-side layer and said third n-side layer have substantially the same compositions or the same band gap energy.

12. The nitride semiconductor device according to claim 10, wherein said first n-side layer has a thickness of 100 nm or larger.

13. The nitride semiconductor device according to claim 10, wherein said first n-side layer and said second n-side layer are made of GaN.

14. The nitride semiconductor device according to claim 10, wherein said first to third n-side layers are made of GaN.

15. The nitride semiconductor device according to claim 10, wherein a fourth n-side layer is provided in contact with the third n-side layer between said third n-side layer and the active layer;
    said forth n-side layer includes an n-type impurity; and
    said fourth n-side layer and said third n-side layer have substantially the same compositions or the same band gap energy.

16. The nitride semiconductor device according to claim 15, wherein said third n-side layer has thickness of 100 nm or larger.

17. The nitride semiconductor device according to claim 15, wherein said fourth n-side layer includes an n-type impurity in a concentration not lower than the concentration of n-type impurity in said second n-side layer.

18. The nitride semiconductor device according to claim 15, wherein a fifth n-side layer is provided between said fourth n-side layer and the active layer, and the concentration of n-type impurity in said fourth n-side layer is higher than the concentration of n-type impurity in said fifth n-side layer.

19. The nitride semiconductor device according to claim 1, wherein said first n-side layer and said second n-side layer are in contact with each other and an area of an interface between said first n-side layer and the second n-side layer is less than 1 mm².

20. The nitride semiconductor device according to claim 1, further comprising:
   a first principal plane provided on a side of the n-side contact layer opposite to the active layer,
   a second principal plane that makes an interface between the n-side contact layer and an adjacent nitride semiconductor layer, and
   a third principal plane that makes an interface between the n electrode and the n-side contact layer,
   wherein the thickness of the n-side contact layer between the first principal plane and the third principal plane is at least 3 μm, or is 80% or less of the thickness of the n-side contact layer between the first principal plane and the second principal plane.

21. The nitride semiconductor device according to claim 10, wherein an area of an interface between said first n-side layer and the second n-side layer is less than 1 mm².

22. The nitride semiconductor device according to claim 10, further comprising:
   a first principal plane provided on a side of the n-side contact layer opposite to the active layer,
   a second principal plane that makes an interface between the n-side contact layer and an adjacent nitride semiconductor layer on the active layer side, and
   a third principal plane that makes an interface between the n electrode and the n-side contact layer,
   wherein the thickness of the n-side contact layer between the first principal plane and the third principal plane is at least 3 μm, or is 80% or less of the thickness of the n-side contact layer between the first principal plane and the second principal plane.

* * * * *